United States Patent
Kohji et al.

(10) Patent No.: US 12,167,598 B2
(45) Date of Patent: Dec. 10, 2024

(54) THREE-DIMENSIONAL SEMICONDUCTOR MEMORY DEVICES, METHODS OF MANUFACTURING THE SAME, AND ELECTRONIC SYSTEMS INCLUDING THE SAME

(71) Applicant: Samsung Electronics Co., Ltd., Suwon-si (KR)

(72) Inventors: Kanamori Kohji, Seongnam-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 441 days.

(21) Appl. No.: 17/703,130

(22) Filed: Mar. 24, 2022

(65) Prior Publication Data

US 2023/0028532 A1    Jan. 26, 2023

(30) Foreign Application Priority Data

Jul. 22, 2021    (KR) .......................... 10-2021-0096289

(51) Int. Cl.
*H10B 43/27*    (2023.01)
*H01L 23/528*    (2006.01)
(Continued)

(52) U.S. Cl.
CPC ......... *H10B 43/27* (2023.02); *H01L 23/5283* (2013.01); *H10B 41/10* (2023.02); *H10B 41/27* (2023.02); *H10B 41/35* (2023.02); *H10B 41/48* (2023.02); *H10B 43/10* (2023.02); *H10B 43/35* (2023.02); *H10B 43/40* (2023.02)

(58) Field of Classification Search
CPC ........ H10B 43/27; H10B 41/10; H10B 41/27; H10B 41/35; H10B 41/48; H10B 43/35
See application file for complete search history.

(56) References Cited

U.S. PATENT DOCUMENTS 10,147,732 B1    12/2018  Hu et al.
10,403,634 B2     9/2019  Hwang et al.
(Continued)

FOREIGN PATENT DOCUMENTS

CN    111540748 A    8/2020
CN    111937148 A    11/2020

*Primary Examiner* — Mark W Tornow
(74) *Attorney, Agent, or Firm* — Myers Bigel, P.A.

(57) ABSTRACT

Disclosed are three-dimensional semiconductor memory devices, methods of manufacturing the same, and electronic systems including the same. The device includes a peripheral circuit structure on a substrate, and a cell array structure including a stack structure that includes gate electrodes on the peripheral circuit structure, a first source conductive pattern on the stack structure, and vertical channel structures in vertical channel holes that penetrate the stack structure and the first source conductive pattern. The vertical channel structure includes a data storage pattern on a sidewall of the vertical channel hole, a vertical semiconductor pattern on the data storage pattern, and a second source conductive pattern on the vertical semiconductor pattern and surrounded by the data storage pattern. A thickness of the data storage pattern between the first source conductive pattern and the second source conductive pattern is greater than it is between the stack structure and the vertical semiconductor pattern.

20 Claims, 27 Drawing Sheets

(51) Int. Cl.
    *H10B 41/10*     (2023.01)
    *H10B 41/27*     (2023.01)
    *H10B 41/35*     (2023.01)
    *H10B 41/48*     (2023.01)
    *H10B 43/10*     (2023.01)
    *H10B 43/35*     (2023.01)
    *H10B 43/40*     (2023.01)

(56) References Cited

U.S. PATENT DOCUMENTS

| | | | |
|---|---|---|---|
| 2018/0006055 A1* | 1/2018 | Kim | H10B 41/35 |
| 2018/0219021 A1* | 8/2018 | Daycock | H01L 29/40117 |
| 2019/0296041 A1 | 9/2019 | Yamasaka et al. | |
| 2020/0127126 A1* | 4/2020 | Lee | H01L 29/66833 |
| 2020/0395341 A1 | 12/2020 | Maejima et al. | |
| 2020/0395367 A1* | 12/2020 | Son | H01L 29/42332 |
| 2021/0036002 A1 | 2/2021 | Lee | |
| 2021/0074720 A1* | 3/2021 | Son | H10B 43/35 |
| 2021/0091063 A1 | 3/2021 | Ninomiya et al. | |
| 2021/0202458 A1 | 7/2021 | Jung et al. | |
| 2021/0296358 A1 | 9/2021 | Kanamori et al. | |

* cited by examiner

THREE-DIMENSIONAL SEMICONDUCTOR MEMORY DEVICES, METHODS OF MANUFACTURING THE SAME, AND ELECTRONIC SYSTEMS INCLUDING THE SAME

CROSS-REFERENCE TO RELATED APPLICATION

This U.S. nonprovisional application claims priority under 35 U.S.C. § 119 to Korean Patent Application No. 10-2021-0096289 filed on Jul. 22, 2021 in the Korean Intellectual Property Office, the disclosure of which is hereby incorporated by reference in its entirety.

BACKGROUND

The present disclosure relates to three-dimensional semiconductor memory devices, methods of fabricating the same, and electronic systems including the same, and more particularly, to a three-dimensional semiconductor memory device including a peripheral circuit structure and a cell array structure that are bonded through bonding pads, a method of fabricating the same, and an electronic system including the same.

It is desirable to have a semiconductor device capable of storing a large amount of data in an electronic system which requires data storage. Semiconductor devices have been highly integrated to meet high performance and low manufacturing cost which are required by customers. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some embodiments of the present disclosure provide a three-dimensional semiconductor memory device whose reliability and electrical characteristics are improved and a simplified method of fabricating the same.

Some embodiments of the present disclosure provide an electronic system including the three-dimensional semiconductor memory device.

An object of the present disclosure is not limited to the mentioned above, and other objects which have not been mentioned above will be clearly understood to those skilled in the art from the following description.

According to some embodiments of the present disclosure, a three-dimensional semiconductor memory device may comprise: a substrate; a peripheral circuit structure on the substrate; and a cell array structure comprising a stack structure that includes a plurality of gate electrodes stacked on the peripheral circuit structure, a first source conductive pattern on the stack structure, and a plurality of vertical channel structures in a plurality of vertical channel holes that penetrate the stack structure and the first source conductive pattern. One or more of the vertical channel structures may include: a data storage pattern on a sidewall of the vertical channel hole; a vertical semiconductor pattern on a sidewall of the data storage pattern; and a second source conductive pattern on the vertical semiconductor pattern and surrounded by the data storage pattern. A thickness of the data storage pattern between the first source conductive pattern and the second source conductive pattern in a first direction may be greater than a thickness of the data storage pattern between the stack structure and the vertical semiconductor pattern in the first direction.

According to some embodiments of the present disclosure, a three-dimensional semiconductor memory device may comprise: a substrate; a peripheral circuit structure on the substrate; and a cell array structure on the peripheral circuit structure. The peripheral circuit structure may include: a plurality of peripheral transistors on the substrate; a plurality of peripheral circuit lines on the peripheral transistors; and a plurality of first bonding pads connected through the peripheral circuit lines to the peripheral transistors. The cell array structure may include: a plurality of second bonding pads, each of which may contact, or be integrally bonded to, one of the first bonding pads of the peripheral circuit structure; a plurality of connection circuit lines on the second bonding pads; a plurality of bit lines connected through the connection circuit lines to the second bonding pads; a stack structure that includes a plurality of gate electrodes stacked on the bit lines; a first source conductive pattern on the stack structure; a plurality of vertical channel structures connected to the bit lines and in a plurality of vertical channel holes that penetrate the stack structure and the first source conductive pattern; a first metal layer on the first source conductive pattern; a second metal layer spaced apart in a first direction from the first metal layer; an insulating layer on the stack structure and the first and second metal layers; a plurality of cell contacts that penetrate the insulating layer and connect with the gate electrodes of the stack structure; and a plurality of through contacts that penetrate the insulating layer and connect with the first and second metal layers. The stack structure may be between the first metal layer and the peripheral circuit structure. One or more of the vertical channel structures may include: a data storage pattern on a sidewall of the vertical channel hole; a vertical semiconductor pattern on a sidewall of the data storage pattern; and a second source conductive pattern surrounded by the data storage pattern and between the vertical semiconductor pattern and the first metal layer. A thickness of the data storage pattern between the first source conductive pattern and the second source conductive pattern in a first direction may be greater than a thickness of the data storage pattern between the stack structure and the vertical semiconductor pattern in the first direction.

According to some embodiments of the present disclosure, an electronic system may comprise: a three-dimensional semiconductor memory device that comprises a substrate, a peripheral circuit structure on the substrate, a cell array structure on the peripheral circuit structure, and an input/output pad on the cell array structure; and a controller configured to connect, such as by electrical connection, through the input/output pad with the three-dimensional semiconductor memory device and to control the three-dimensional semiconductor memory device. The cell array structure may include: a stack structure that includes a plurality of gate electrodes stacked on the peripheral circuit structure; a first source conductive pattern on the stack structure; and a plurality of vertical channel structures in a plurality of vertical channel holes that penetrate the stack structure and the first source conductive pattern. One or more of the vertical channel structures may include: a data storage pattern on a sidewall of the vertical channel hole; a vertical semiconductor pattern on a sidewall of the data storage pattern; and a second source conductive pattern on the vertical semiconductor pattern and surrounded by the data storage pattern. The data storage pattern may include: a first portion between the first source conductive pattern and the second source conductive pattern; and a second portion between the stack structure and the vertical semiconductor pattern. A thickness of the first portion may be greater than a thickness of the second portion.

DETAILED DESCRIPTION OF EMBODIMENTS

The following will now describe in detail a three-dimensional semiconductor memory device, a method of fabricating the same, and an electronic system including the same according to some embodiments of the present disclosure in conjunction with the accompanying drawings.

Figure 1:
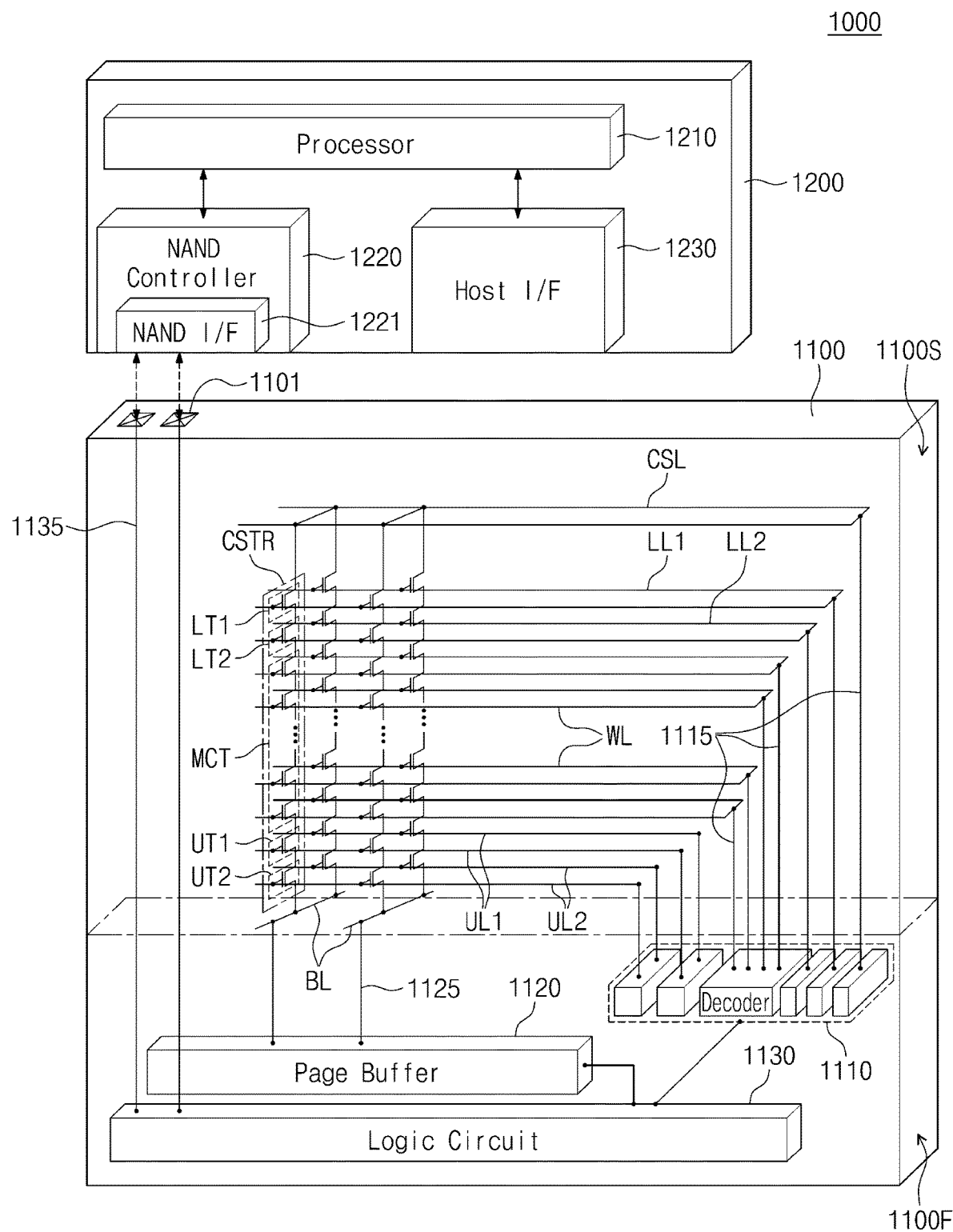
FIG. 1 illustrates a simplified block diagram showing an electronic system that includes a three-dimensional semiconductor memory device according to some embodiments of the present disclosure.

FIG. 1 illustrates a simplified block diagram showing an electronic system that includes a three-dimensional semiconductor memory device according to some embodiments of the present disclosure.

Referring to FIG. 1, an electronic system 1000 according to some embodiments of the present disclosure may include a three-dimensional semiconductor memory device 1100 and a controller 1200 connected, such as by electrical connection, to the three-dimensional semiconductor memory device 1100. The electronic system 1000 may be a storage device that includes a single three-dimensional semiconductor memory device 1100 or a plurality of three-dimensional semiconductor memory devices 1100, or may be an electronic device that includes the storage device. For example, the electronic system 1000 may be a solid state drive (SSD) device, a universal serial bus (USB), a computing system, a medical apparatus, or a communication apparatus, each of which may include a single three-dimensional semiconductor memory device 1100 or a plurality of three-dimensional semiconductor memory devices 1100.

The three-dimensional semiconductor memory device 1100 may be a nonvolatile memory device, such as a three-dimensional NAND Flash memory device which will be discussed below. The three-dimensional semiconductor memory device 1100 may include a first region 1100F and a second region 1100S on the first region 1100F. In some embodiments, different from that shown, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that include bit lines BL, a common source line CSL, word lines WL, first lines LL1 and LL2, second lines UL1 and UL2, and memory cell strings CSTR between the bit lines BL and the common source line CSL.

On the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and of the second transistors UT1 and UT2 may be variously changed in accordance with embodiments. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may be gate electrodes of the first transistors LT1 and LT2, respectively. The word lines WL may be gate electrodes of the memory cell transistors MCT, and the second lines UL1 and UL2 may be gate electrodes of the second transistors UT1 and UT2.

For example, the first transistors LT1 and LT2 may include a first erasure control transistor LT1 and a ground selection transistor LT2 that are connected in series. For example, the second transistors UT1 and UT2 may include a string selection transistor UT1 and a second erasure control transistor UT2 that are connected in series. One or both of the first and second erasure control transistors LT1 and UT2 may be employed to perform an erase operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be connected, such as by electrical connection, to the decoder circuit 1110 through first connection lines 1115 that extend from the first region 1100F toward the second region 1100S. The bit lines BL may be connected, such as by electrical connection, to the page buffer 1120 through second connection lines 1125 that extend from the first region 1100F toward the second region 1100S.

On the first region 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. According to some embodiments, the electronic system 1000 may include a plurality of three-dimensional semiconductor memory devices 1100, and in this case, the controller 1200 may control the plurality of three-dimensional semiconductor memory devices 1100.

The processor 1210 may control an overall operation of the electronic system 1000 that includes the controller 1200. The processor 1210 may operate based on certain firmware and may control the NAND controller 1220 to access the three-dimensional semiconductor memory device 1100. The NAND controller 1220 may include NAND interface 1221 that processes communication with the three-dimensional semiconductor memory device 1100. The NAND interface 1221 may be used to transfer a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
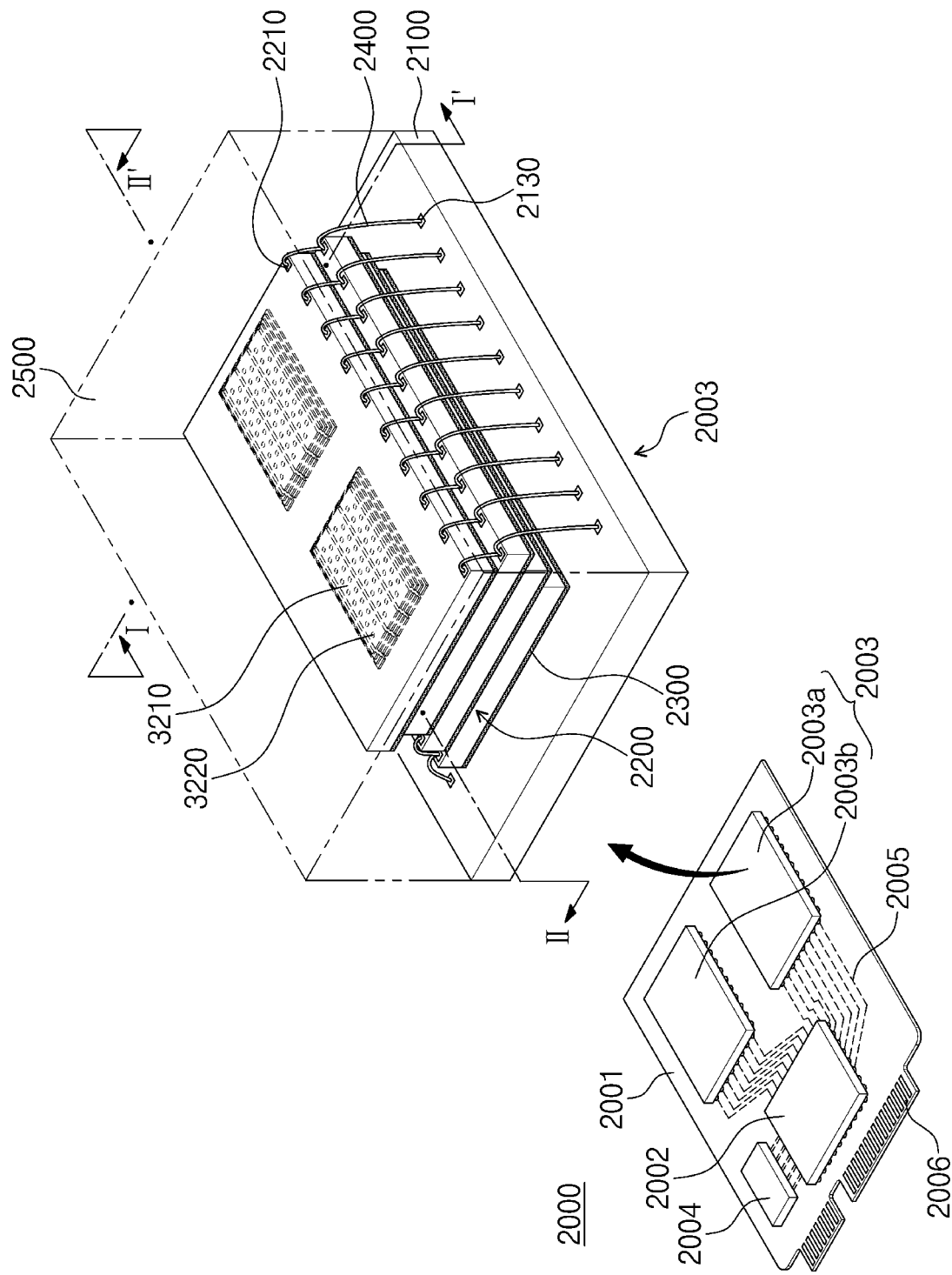
FIG. 2 illustrates a simplified perspective view showing an electronic system that includes a three-dimensional semiconductor memory device according to some embodiments of the present disclosure.

FIG. 2 illustrates a simplified perspective view showing an electronic system that includes a three-dimensional semiconductor memory device according to some embodiments of the present disclosure.

Referring to FIG. 2, an electronic system 2000 according to some embodiments of the present disclosure may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and an external host. The electronic system 2000 may communicate with an external host through one or more interfaces, for example, universal serial bus (USB), peripheral component interconnect express (PIC-Express), serial advanced technology attachment (SATA), and M-PHY for universal flash storage (UFS). For example, the electronic system 2000 may operate with power supplied through the connector 2006 from an external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between an external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003a and 2003b that are spaced apart from each other. Each of the first and second semiconductor packages 2003a and 2003b may include a plurality of semiconductor chips 2200. Each of the first and second semiconductor packages 2003a and 2003b may include a package substrate 2100, semiconductor chips 2200 on the package substrate 2100, adhesion layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and memory channel structures 3220. Each of the semiconductor chips 2200 may include a three-dimensional semiconductor memory device which will be discussed below.

The connection structures 2400 may be, for example, bonding wires that electrically connect the input/output pads 2210 to the package upper pads 2130. Therefore, on each of the first and second semiconductor packages 2003a and 2003b, the semiconductor chips 2200 may be electrically connected to each other in a wire bonding manner and may be electrically connected to the package upper pads 2130 of the package substrate 2100. In some embodiments, on each of the first and second semiconductor packages 2003a and 2003b, the semiconductor chips 2200 may be electrically connected to each other using through-silicon vias instead of the connection structures 2400 or the bonding wires.

Differently from that shown in FIG. 2, the controller 2002 and the semiconductor chips 2200 may be included in a single package. The controller 2002 and the semiconductor chips 2200 may be mounted on a separate interposer substrate other than the main board 2001, and may be connected to each other through wiring lines provided in the interposer substrate.

Figure 3:
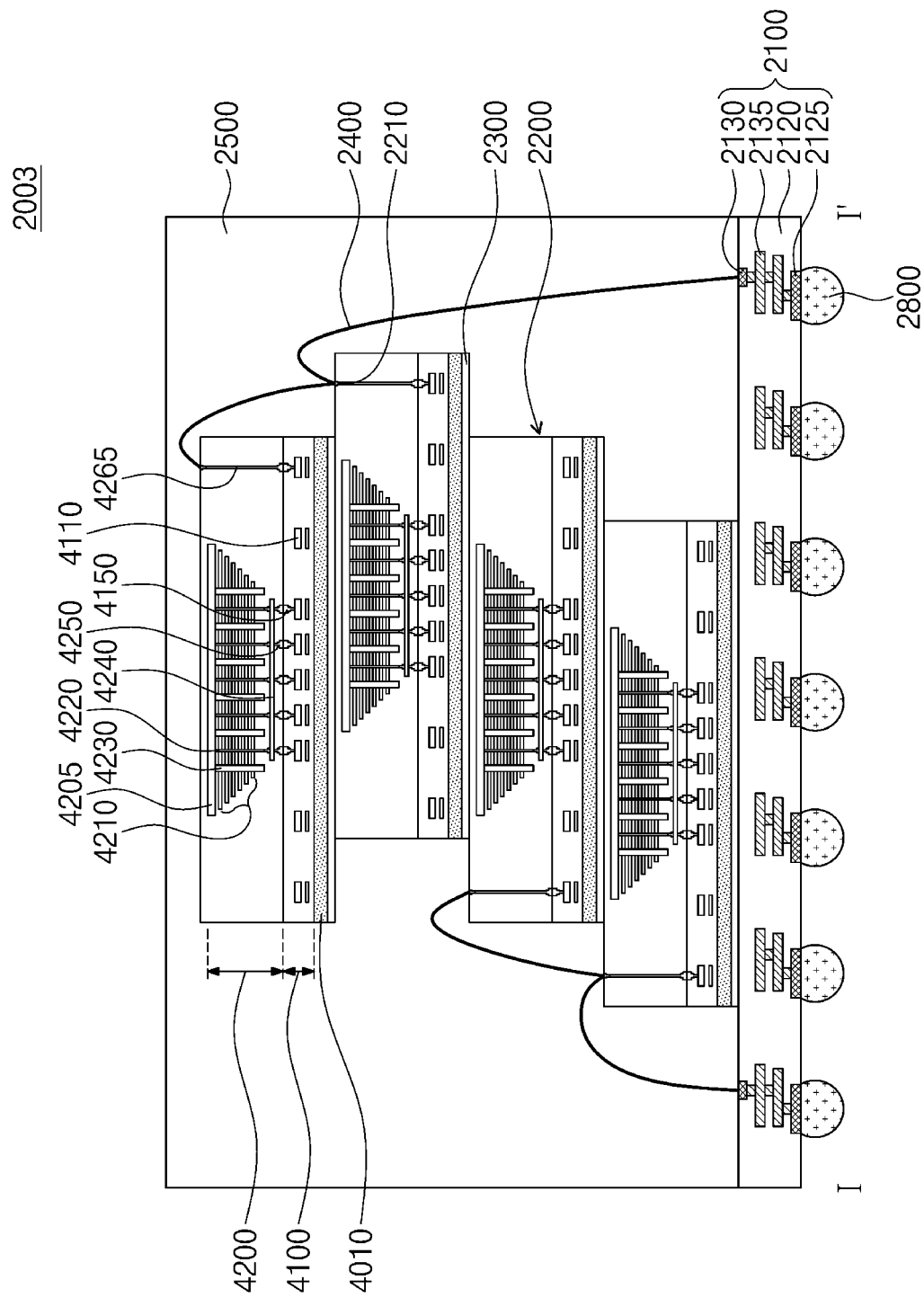
FIGS. 3 and 4 illustrate cross-sectional views respectively taken along lines I-I' and II-II' of FIG. 2, respectively, showing a semiconductor package that includes a three-dimensional semiconductor memory device according to some embodiments of the present disclosure.
Figure 4:
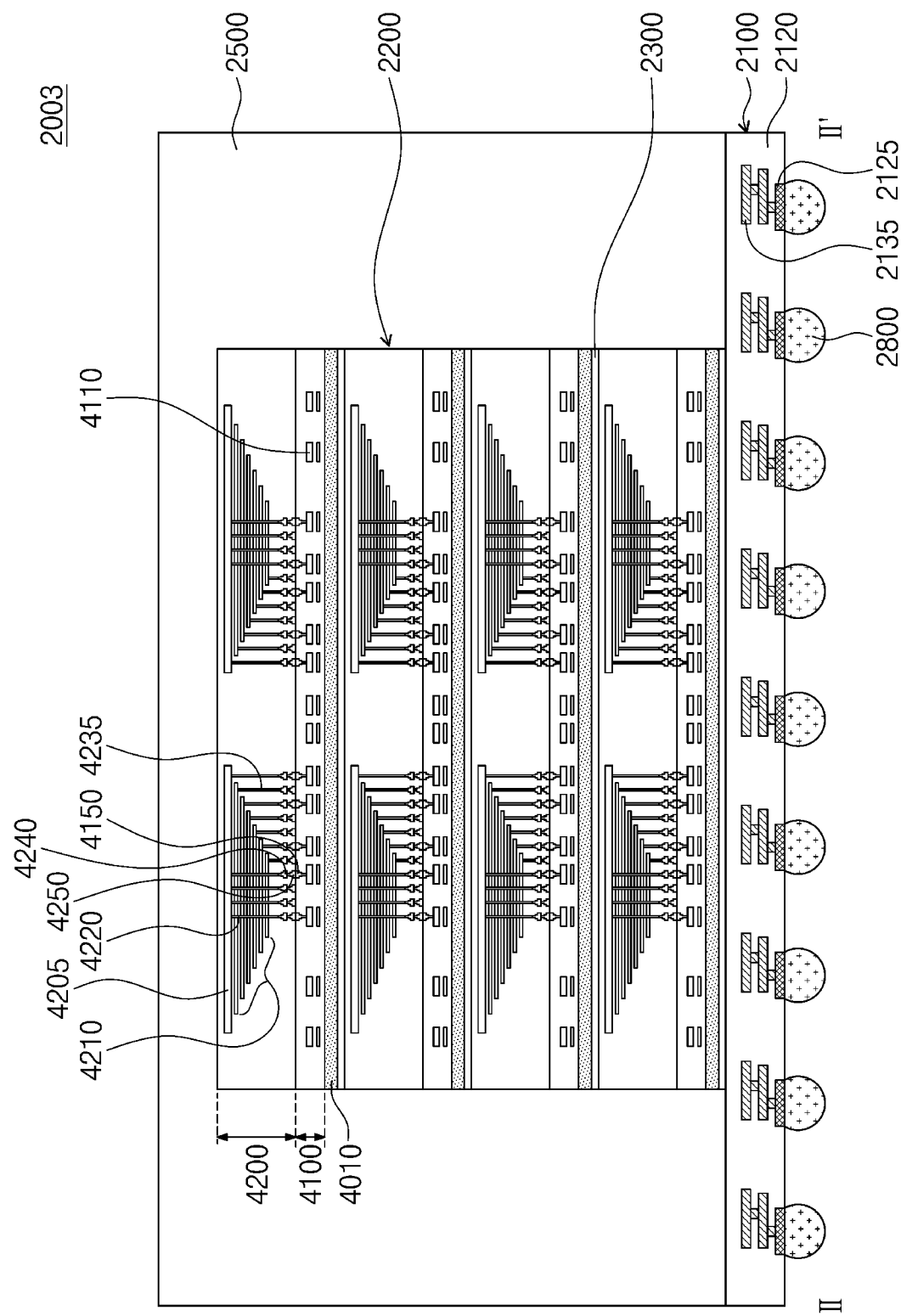

FIGS. 3 and 4 illustrate cross-sectional views respectively taken along lines I-I' and II-II' of FIG. 2, showing a semiconductor package that includes a three-dimensional semiconductor memory device according to some embodiments of the present disclosure.

Referring to FIGS. 3 and 4, a semiconductor package 2003 may include a package substrate 2100, a plurality of semiconductor chips 2200 on the package substrate 2100, and a molding layer 2500 that covers the package substrate 2100 and the semiconductor chips 2200.

The package substrate 2100 may include a package substrate body 2120, upper pads 2130 disposed or exposed on a top surface of the package substrate body 2120, lower pads 2125 disposed or exposed on a bottom surface of the package substrate body 2120, and internal lines 2135 that lie in the package substrate body 2120 and electrically connect the upper pads 2130 to the lower pads 2125. The upper pads 2130 may be electrically connected to connection structures 2400. The lower pads 2125 may be connected through conductive connectors 2800 to the wiring patterns 2005 in the main board 2001 of the electronic system 2000 depicted in FIG. 2.

Referring to FIGS. 2-4, the semiconductor chips 2200 may have one or more sidewalls that are not aligned with each other and may also have one or more sidewalls that are aligned with each other. The semiconductor chips 2200 may be electrically connected to each other thorough the connection structures 2400 shaped like bonding wires. The semiconductor chips 2200 may be configured substantially identical to each other in one embodiment.

Referring to FIGS. 3 and 4, each of the semiconductor chips 2200 may include a semiconductor substrate 4010, a first structure 4100 on the semiconductor substrate 4010, and a second structure 4200 on the first structure 4100. The second structure 4200 and the first structure 4100 may be bonded to each other in a wafer bonding manner.

The first structure 4100 may include peripheral circuit lines 4110 and first bonding pads 4150. The second structure 4200 may include a common source line 4205, a gate stack structure 4210 between the common source line 4205 and the first structure 4100, memory channel structures 4220 and separation structures 4230 that penetrate the gate stack structure 4210, and second bonding pads 4250 that are correspondingly electrically connected to the memory channel structures 4220 and the word lines (see WL of FIG. 1) of the gate stack structure 4210. For example, the second bonding pads 4250 may be correspondingly electrically connected to the memory channel structures 4220 and the word lines (see WL of FIG. 1) through bit lines 4240 electrically connected to the memory channel structures 4220 and through gate connection lines 4235 electrically connected to the word lines (see WL of FIG. 1). The first bonding pads 4150 of the first structure 4100 may be bonded to and in contact with the second bonding pads 4250 of the second structure 4200. The first and second bonding pads 4150 and 4250 may have their contact portions including, for example, copper (Cu).

Each of the semiconductor chips 2200 may further include input/output pads 2210 and input/output connection lines 4265 below the input/output pads 2210. The input/output connection line 4265 may be electrically connected to one of the second bonding pads 4250 and one of the peripheral circuit lines 4110.

Figure 5:
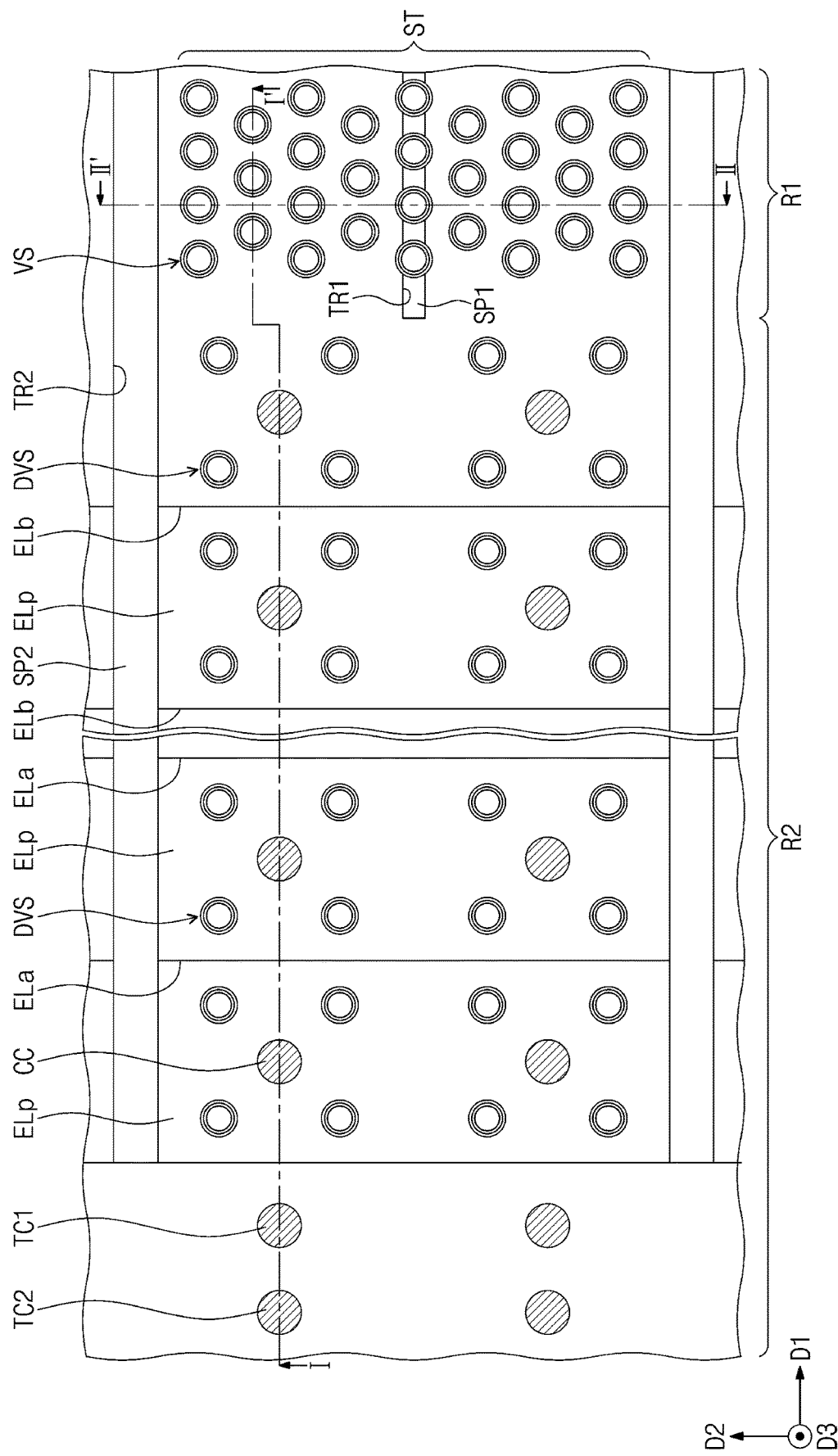
FIG. 5 illustrates a plan view showing a three-dimensional semiconductor memory device according to some embodiments of the present disclosure.
Figure 6:
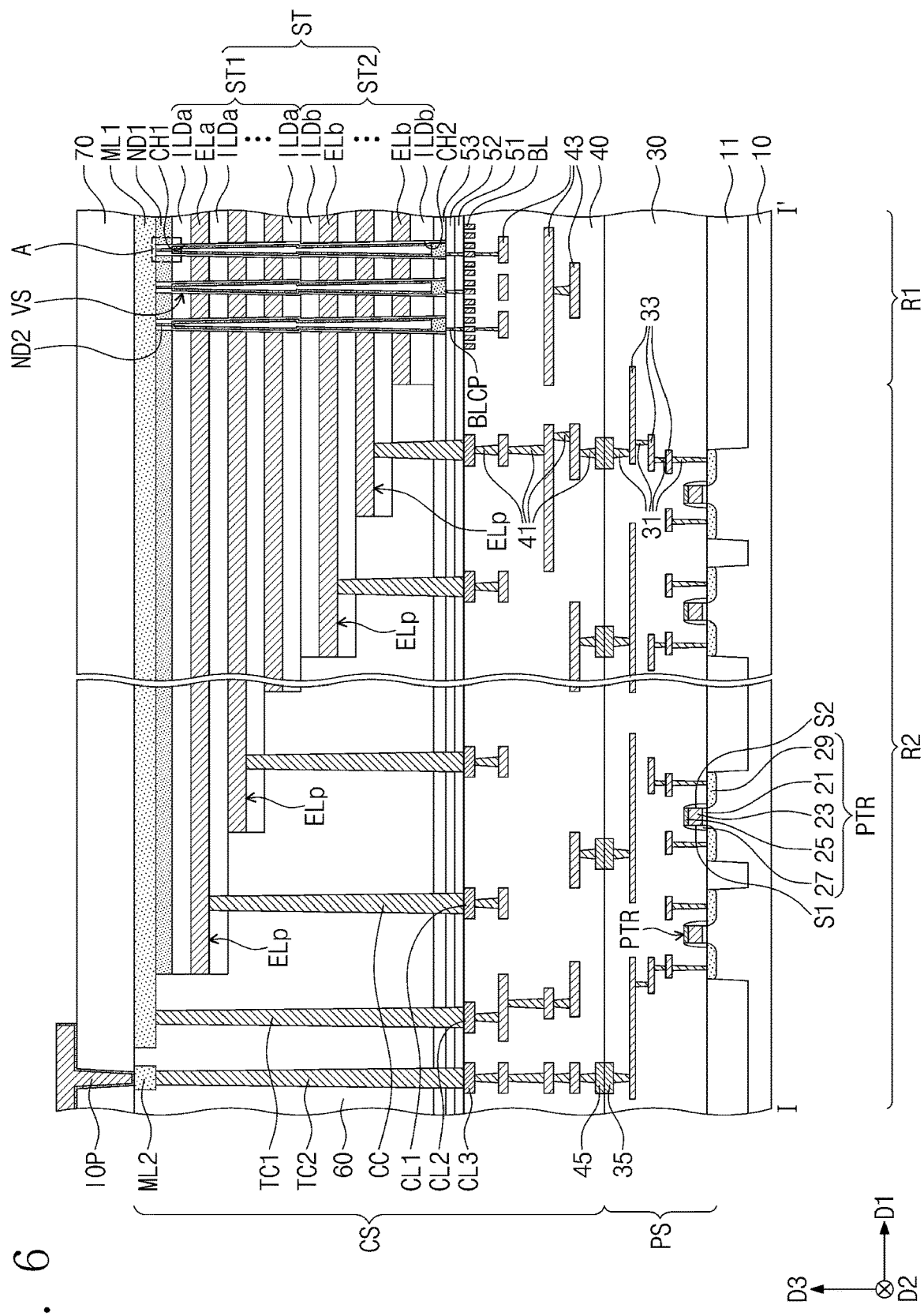
FIGS. 6 and 7 illustrate cross-sectional views respectively taken along lines I-I' and II-II' of FIG. 5, respectively, showing a three-dimensional semiconductor memory device according to some embodiments of the present disclosure.
Figure 7:
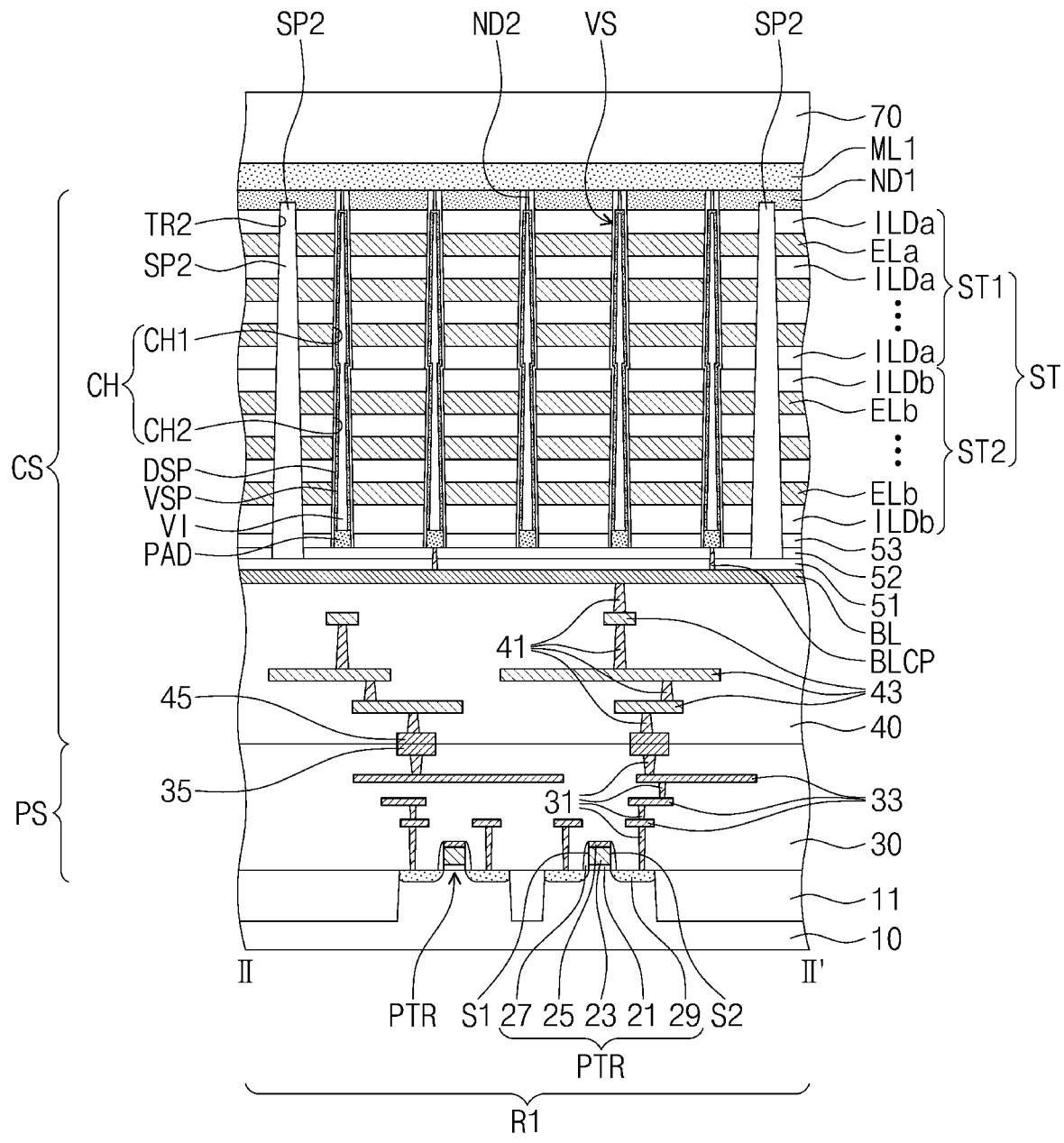

FIG. 5 illustrates a plan view showing a three-dimensional semiconductor memory device according to some embodiments of the present disclosure. FIGS. 6 and 7 illustrate cross-sectional views respectively taken along lines I-I' and II-II' of FIG. 5, respectively, showing a three-dimensional semiconductor memory device according to some embodiments of the present disclosure.

Referring to FIGS. 5, 6, and 7, a three-dimensional semiconductor memory device according to the present disclosure may include a first substrate 10, a peripheral circuit structure PS on the first substrate 10, and a cell array structure CS on the peripheral circuit structure PS. The first substrate 10, the peripheral circuit structure PS, and the cell array structure CS may respectively correspond to the semiconductor substrate 4010, the first structure 4100 on the semiconductor substrate 4010, and the second structure 4200 on the first structure 4100 of FIG. 3 or 4.

As the cell array structure CS is bonded onto the peripheral circuit structure PS, it may be possible to increase a cell capacity per unit area of the three-dimensional semiconductor memory device according to the present disclosure. In addition, as the peripheral circuit structure PS and the cell array structure CS are manufactured separately and then bonded to each other, the peripheral transistors PTR may be prevented from being damaged due to various heat treatment processes, and accordingly, it may be possible to improve reliability and electrical characteristics of the three-dimensional semiconductor memory device according to the present disclosure.

The first substrate 10 may be, for example, a silicon substrate, a silicon-germanium substrate, a germanium substrate, or a monocrystalline epitaxial layer grown on a monocrystalline silicon substrate. The first substrate 10 may have a top surface that is parallel to a first direction D1 and a second direction D2 intersecting the first direction D1 and is perpendicular to a third direction D3. In the following description with reference to FIGS. 6, 7, and 8, the term "top surface" is defined to indicate a surface directed in the third direction D3, and the term "bottom surface" is defined to indicate a surface directed in a direction opposite the third direction D3. The first, second, and third directions D1, D2, and D3 may be directions orthogonal to each other. A device isolation layer 11 may be provided in the first substrate 10. The device isolation layer 11 may define an active section of the first substrate 10.

The first substrate 10 may include a first region R1 and a second region R2. The second region R2 may extend from the first region R1 in the first direction D1 or in a direction opposite the first direction D1. The first region R1 may be an area where are provided vertical channel structures VS which will be discussed below, and the second region R2 may be an area where is provided a stepwise structure of a stack structure ST which will be discussed below.

The first substrate 10 may be provided thereon with the peripheral circuit structure PS that includes peripheral transistors PTR, peripheral contact plugs 31, peripheral circuit lines 33 electrically connected through the peripheral contact plugs 31 to the peripheral transistors PTR, first bonding pads 35 electrically connected to the peripheral circuit lines 33, and a first insulating layer 30 that surrounds the peripheral transistors PTR, the peripheral contact plugs 31, and the peripheral circuit lines 33. It will be understood that "an element A surrounds an element B" (or similar language) as used herein means that the element A is at least partially around the element B but does not necessarily mean that the element A completely encloses the element B. The peripheral transistors PTR may be disposed on the active section of the first substrate 10. The peripheral circuit lines 33 may correspond to the peripheral circuit lines 4110 of FIG. 3 or 4, and the first bonding pads 35 may correspond to the first bonding pads 4150 of FIG. 3 or 4.

The peripheral contact plugs 31 may have widths that increase in the third direction D3 (or increase with increasing distance from the first substrate 10). The peripheral contact plugs 31 and the peripheral circuit lines 33 may include a conductive material, such as metal.

Still referring to FIGS. 6 and 7, the peripheral transistors PTR may constitute, for example, a decoder circuit (see 1100 of FIG. 1), a page buffer (see 1120 of FIG. 1), and a logic circuit (see 1130 of FIG. 1). For example, each of the peripheral transistors PTR may include a peripheral gate dielectric layer 21, a peripheral gate electrode 23, a peripheral capping pattern 25, a peripheral gate spacer 27, and peripheral source/drain sections 29. The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover sidewalls S1 and S2 of the peripheral gate dielectric layer 21, the peripheral gate electrode 23, and the peripheral capping pattern 25. The peripheral source/drain sections 29 may be provided in the first substrate 10 adjacent to opposite sides of the peripheral gate electrode 23. The peripheral circuit lines 33 and the first bonding pads 35 may be electrically connected through the peripheral contact plugs 31 to the peripheral transistors PTR. Each of the peripheral transistors PTR may be, for example, an NMOS transistor, a PMOS transistor, or a gate-all-around type transistor.

The first insulating layer 30 may be disposed on the first substrate 10. On the first substrate 10, the first insulating layer 30 may surround the peripheral transistors PTR, the peripheral contact plugs 31, and the peripheral circuit lines 33. The first insulating layer 30 may include a plurality of dielectric layers that constitute a multi-layered structure. The first insulating layer 30 may include, for example, one or more of silicon oxide, silicon nitride, silicon oxynitride, and low-k dielectric materials. The first insulating layer 30 may not be on top surfaces of the first bonding pads 35. The first insulating layer 30 may have a top surface substantially coplanar with those of the first bonding pads 35 in some embodiments.

The peripheral circuit structure PS may be provided thereon with the cell array structure CS that includes second bonding pads 45, bit lines BL, and a stack structure ST. The second bonding pads 45, the bit lines BL, and the stack structure ST may respectively correspond to the second bonding pads 4250, the bit lines 4240, and the gate stack structure 4210 of FIG. 3 or 4.

Still referring to FIGS. 6 and 7, a second insulating layer 40 may be provided on the first insulating layer 30. The second insulating layer 40 may include second bonding pads 45 in contact with the first bonding pads 35 of the peripheral circuit structure PS. The second insulating layer 40 may further include connection contact plugs 41 and connection circuit lines 43 electrically connected through the connection contact plugs 41 to the second bonding pads 45. The second insulating layer 40 surrounds the second bonding pads 45, the connection contact plugs 41, and the connection circuit lines 43. The second insulating layer 40 may include a plurality of dielectric layers that constitute a multi-layered structure. The second insulating layer 40 may include, for example, one or more of silicon oxide, silicon nitride, silicon oxynitride, and low-k dielectric materials.

The connection contact plugs 41 may have widths that decrease in the third direction D3. The connection contact plugs 41 and the connection circuit lines 43 may include a conductive material, such as metal.

The second insulating layer 40 may not cover bottom surfaces of the second bonding pads 45. The second insulating layer 40 may have a bottom surface substantially coplanar with those of the second bonding pads 45. The bottom surfaces of the second bonding pads 45 may be correspondingly in direct contact with the top surfaces of the first bonding pads 35. The first and second bonding pads 35 and 45 may include metal, such as copper (Cu), tungsten (W), aluminum (Al), nickel (Ni), or tin (Sn). For example, the first and second bonding pads 35 and 45 may include copper (Cu). The first and second bonding pads 35 and 45 may be integrally bonded and constitute a single unitary body (e.g. monolithic) without any interface therebetween. The first and second bonding pads 35 and 45 are illustrated in FIGS. 6 and 7 to have sidewalls aligned with each other, but the present disclosure is not limited thereto. For example, when viewed in plan, the first and second bonding pads 35 and 45 may have sidewalls spaced apart from each other.

The second insulating layer 40 may have in its upper portion the bit lines BL in contact with the connection contact plugs 41 and also have first, second, and third conductive lines CL1, CL2, and CL3 (see FIG. 3) in contact with the connection contact plugs 41. For example, the bit lines BL and the first, second, and third conductive lines CL1, CL3, and CL3 may extend in the second direction D2 and may be spaced apart from each other in the first direction D1. The bit lines BL and the first, second, and third conductive lines CL1, CL2, and CL3 may include a conductive material, such as metal.

A third insulating layer 51, a fourth insulating layer 52, and a fifth insulating layer 53 may be sequentially provided on the second insulating layer 40. The fifth insulating layer 53 may be provided thereon with a sixth insulating layer 60 and with the stack structure ST surrounded by the sixth insulating layer 60. Each of the third, fourth, fifth, and sixth insulating layers 51, 52, 53, and 60 may include a plurality of dielectric layers that constitute a multi-layered structure. For example, each of the third, fourth, fifth, and sixth insulating layers 51, 52, 53, and 60 may include one or more of silicon oxide, silicon nitride, silicon oxynitride, and low-k dielectric materials.

A plurality of bit-line contact plugs BLCP may be provided to penetrate the third insulating layer 51 and the fourth insulating layer 52. The bit-line contact plugs BLCP may extend in the third direction D3 and may connect the bit lines BL to vertical channel structures BS which will be discussed below.

Still referring to FIGS. 6 and 7, a plurality of cell contacts CC and first and second through contacts TC1 and TC2 may be provided to penetrate the third, fourth, fifth, and sixth insulating layers 51, 52, 53, and 60. The cell contacts CC may extend in the third direction D3 and may connect the first conductive lines CL1 to first and second gate electrodes ELa and ELb of the stack structure ST. Each of the cell contacts CC may penetrate one of first and second interlayer dielectric layers ILDa and ILDb of the stack structure ST.

The first through contact TC1 may extend in the third direction D3 and may connect the second conductive line CL2 to a first metal layer ML1 which will be discussed below. The second through contact TC2 may extend in the third direction D3 and may connect the third conductive line CL3 through a second metal layer ML2 to an input/output pad IOP which will be discussed below. The first and second through contacts TC1 and TC2 may be spaced apart in the first direction D1 from the stack structure ST and an outermost one of the cell contacts CC. The second through contact TC2 may be spaced apart in the first direction D1 from the stack structure ST across the first through contact TC1. The second through contact TC2 may correspond to the input/output connection line 4265 of FIG. 3. The input/output pad IOP may correspond to the input/output pad 1101 of FIG. 1, the input/output pad 2210 of FIG. 2, or the input/output pad 2210 of FIG. 3 or 4.

The cell contacts CC and the first and second through contacts TC1 and TC2 may be spaced apart from each other in the first direction D1. The bit-line contact plugs BLCP, the first and second through contact plugs TCP1 and TCP2, the cell contacts CC, and the first and second through contacts TC1 and TC2 may have widths that decrease in the third direction D3. The bit-line contact plugs BLCP, the first and second through contact plugs TCP1 and TCP2, the cell contacts CC, and the first and second through contacts TC1 and TC2 may include a conductive material, such as metal.

The stack structure ST may be provided in plural. When viewed in plan as shown in FIG. 5, the plurality of stack structures ST may extend in the first direction D1 and may be spaced apart from each other in the second direction D2. For convenience of description, the following will explain a single stack structure ST, and the explanation may be identically applicable to other stack structures ST.

The stack structure ST may include a first stack structure ST1 and a second stack structure ST2. The first stack structure ST1 may include first interlayer dielectric layers ILDa and first gate electrodes ELa that are alternately stacked, and the second stack structure ST2 may include second interlayer dielectric layers ILDb and second gate electrodes ELb that are alternately stacked.

The second stack structure ST2 may be provided between the first stack structure ST1 and the first substrate 10. For example, the second stack structure ST2 may be provided on a bottom surface of a lowermost one of the first interlayer dielectric layers ILDa included in the first stack structure ST1. Although an uppermost one of the second interlayer dielectric layers ILDb included in the second stack structure ST2 may be in contact with the lowermost one of the first interlayer dielectric layers ILDa included in the first stack structure ST1, as shown in FIGS. 6 and 7, the present disclosure is not limited thereto, and a single-layered dielectric layer may be provided between an uppermost one of the second gate electrodes ELb included in the second stack structure ST2 and a lowermost one of the first gate electrodes ELa included in the first stack structure ST1.

The first and second gate electrodes ELa and ELb may include, for example, at least one selected from doped semiconductors (e.g., doped silicon), metals (e.g., tungsten, copper, or aluminum), conductive metal nitrides (e.g., titanium nitride, or tantalum nitride), and transition metals (e.g., titanium or tantalum). The first and second interlayer dielectric layers ILDa and ILDb may include one or more of silicon oxide, silicon nitride, silicon oxynitride, and low-k dielectric materials. For example, the first and second interlayer dielectric layers ILDa and ILDb may include high-density plasma (HDP) oxide or tetraethylorthosilicate (TEOS).

On the second region R2, each of the first and second stack structures ST1 and ST2 may have a thickness in the third direction D3 that decreases with increasing distance from an outermost one of vertical channel structures VS which will be discussed below. For example, each of the first and second stack structures ST1 and ST2 may have a stepwise structure.

For example, the first gate electrodes ELa of the first stack structure ST1 may have lengths in the first direction D1 that increase with increasing distance from the first substrate 10, and this may also be true for the second gate electrodes ELb of the second stack structure ST2. When viewed in plan as shown in FIG. 5, the first and second gate electrodes ELa and ELb may have sidewalls that are spaced apart from each other at a regular interval along the first direction D1. A lowermost one of the second gate electrodes ELb included in the second stack structure ST2 may have the smallest length in the first direction D1, and an uppermost one of the first gate electrodes ELa included in the first stack structure ST1 may have the largest length in the first direction D1.

The first and second gate electrodes ELa and ELb may include pad parts ELp on the second region R2. The pad parts ELp may be located at different positions horizontally and vertically. The pad parts ELp may constitute a stepwise structure along the first direction D1. Each of the cell contacts CC may penetrate one of the first and second interlayer dielectric layers ILDa and ILDb to come into contact with one of the pad parts ELp of the first and second gate electrodes ELa and ELb.

The first and second interlayer dielectric layers ILDa and ILDb may be provided between the first and second gate electrodes ELa and ELb, and may each have a sidewall aligned with that of an overlaying one of the first and second gate electrodes ELa and ELb. For example, like the first and second gate electrodes ELa and ELb, the first and second interlayer dielectric layers ILDa and ILDb may have lengths in the first direction D1 that increase with increasing distance from the first substrate 10.

Still referring to FIGS. 6 and 7, a first source conductive pattern ND1 may be disposed on the stack structure ST. The first source conductive pattern ND1 may be interposed between an uppermost first interlayer dielectric layer ILDa of the stack structure ST and a first metal layer ML1 which will be discussed below. In some embodiments, the first source conductive pattern ND1 may have a bottom surface parallel to the top surface of the first substrate 10. The first source conductive pattern ND1 may extend from the first region R1 toward the second region R2, and may have a plate shape that extends in the first and second directions D1 and D2. The first source conductive pattern ND1 may not be provided on a portion of the second region R2, and may be spaced apart in the first direction D1 from the first and second through contacts TC1 and TC2. The first source conductive pattern ND1 may include a semiconductor material doped with impurities having a first conductivity type (e.g., n-type).

A first metal layer ML1 may be provided on the first source conductive pattern ND1. The first metal layer ML1 may be interposed between the first source conductive pattern ND1 and a seventh insulating layer 70 which will be discussed below. The first metal layer ML1 may have a bottom surface parallel to the top surface of the first substrate 10. The first metal layer ML1 may extend from the first region R1 toward the second region R2, and may have a plate shape that extends in the first and second directions D1 and D2. At least a portion of the first metal layer ML1 may be in contact with the sixth insulating layer 60 without being covered with the first source conductive pattern ND1. When viewed in plan, the first metal layer ML1 may have a sidewall that is spaced apart in a horizontal direction from a sidewall of the first source conductive pattern ND1. The first metal layer ML1 may be in direct contact with the first through contact TC1. The first source conductive pattern ND1 and the first metal layer ML1 may correspond to the common source line CSL of FIG. 1 or the common source line 4205 of FIG. 3 or 4.

A second metal layer ML2 may be provided which is spaced apart in a horizontal direction from the first metal layer ML1. The second metal layer ML2 may be provided on a portion of the second region R2 and may be in direct contact with the second through contact TC2. The second metal layer ML2 may electrically connect the input/output pad TOP through the second through contact TC2 to at least one of the peripheral transistors PTR included in the peripheral circuit structure PS. The first and second metal layers ML1 and ML2 may include metal, such as copper (Cu), tungsten (W), aluminum (Al), nickel (Ni), or tin (Sn). The first and second metal layers ML1 and ML2 may further include a plurality of metal layers including different metals and barrier layers between the plurality of metal layers.

A seventh insulating layer 70 may be provided on the first and second metal layers ML1 and ML2. The input/output pad TOP provided on the seventh insulating layer 70 may penetrate at least a portion of the seventh insulating layer 70 to have an electrical connection with the second metal layer ML2. The seventh insulating layer 70 may include a plurality of dielectric layers. The seventh insulating layer 70 may include, for example, one or more of silicon oxide, silicon nitride, silicon oxynitride, and low-k dielectric materials. Although not shown, the seventh insulating layer 70 may be provided therein or thereon with additional vias, additional wiring lines, and/or additional dielectric layers.

On the first region R1, vertical channel structures VS may be provided in vertical channel holes CH that penetrate in the third direction D3 through the fifth insulating layer 53, the stack structure ST, and the first source conductive pattern ND1. When viewed in plan, the vertical channel structures VS may be arranged in a zigzag fashion along the first direction D1 or the second direction D2. The vertical channel structures VS may correspond to the memory channel structures 4220 of FIG. 3 or 4. The vertical channel structures VS may correspond to channels of the first transistors LT1 and LT2, channels of the memory cell transistors MCT, and channels of the second transistors UT1 and UT2, which transistors LT1, LT2, MCT, UT1, and UT2 are depicted in FIG. 1.

On the second region R2, dummy vertical channel structures DVS may be provided in vertical channel holes CH that penetrate in the third direction D3 through at least a portion of the stack structure ST, the fifth insulating layer 53, the sixth insulating layer 60, and the first source conductive pattern ND1. The dummy vertical channel structures DVS may penetrate the pad parts ELp of the first and second gate electrodes ELa and ELb. When viewed in plan as shown in FIG. 5, the dummy vertical channel structures DVS may be provided around the cell contacts CC. The dummy vertical channel structures DVS and the vertical channel structures VS may be formed simultaneously with each other and may have substantially the same structure. However, the dummy vertical channel structures DVS may not be provided in accordance with some embodiments.

The vertical channel holes CH may include first vertical channel holes CH1 and second vertical channel holes CH2 that are spatially connected in the third direction D3 to the first vertical channel holes CH1. Each of the first and second vertical channel holes CH1 and CH2 may have a width that decreases in the third direction D3. The first and second vertical channel holes CH1 and CH2 may have diameters that are different from each other at a boundary where the first and second vertical channel holes CH1 and CH2 are spatially connected to each other. For example, each of the second vertical channel holes CH2 may have at its upper portion a diameter less than that at a lower portion of each of the first vertical channel holes CH1.

Each of the vertical channel structures VS may include: a conductive pad PAD adjacent to the fourth insulating layer 52; a data storage pattern DSP on an inner sidewall S3 of each of the first and second vertical channel holes CH1 and CH2; a vertical semiconductor pattern VSP on a portion of an inner sidewall S4 of the data storage pattern DSP; a buried dielectric pattern VI that fills at least a portion of an inner space of each of the first and second vertical channel holes CH1 and CH2, wherein the inner space is surrounded by the vertical semiconductor pattern VSP and the conductive pad PAD; and a second source conductive pattern ND2 that is provided on the vertical semiconductor pattern VSP and is surrounded by the data storage pattern DSP. The vertical channel structures VS may each have a bottom surface that has, for example, a circular shape, an oval shape, or a bar shape.

The vertical semiconductor pattern VSP may be provided between the data storage pattern DSP and the buried dielectric pattern VI. The vertical semiconductor pattern VSP may be surrounded by the data storage pattern DSP and the second source conductive pattern ND2. The vertical semiconductor pattern VSP may have a macaroni shape or a pipe shape whose top end is closed. The data storage pattern DSP may have a macaroni shape or a pipe shape whose top end is opened.

The second source conductive pattern ND2 may be surrounded by the data storage pattern DSP and the vertical semiconductor pattern VSP. The second source conductive pattern ND2 may be in contact with a top surface of the vertical semiconductor pattern VSP and the bottom surface of the first metal layer ML1. For example, the second source conductive pattern ND2 may have a width that decreases in the third direction D3.

The conductive pad PAD may include, for example, a semiconductor material or a conductive material. The data storage pattern DSP may include a plurality of dielectric layers that are sequentially stacked on the inner sidewall S3 of the vertical channel hole CH. The vertical semiconductor pattern VSP may include, for example, a semiconductor material. The buried dielectric pattern VI may include, for example, silicon oxide. The second source conductive pattern ND2 may include the same material as that of the first source conductive pattern ND1.

When viewed in plan as shown in FIG. 5, a first trench TR1 and second trenches TR2 may be provided to extend in the first direction D1 and to run across the stack structure ST. The first trench TR1 may be provided on the first region R1, and the second trenches TR2 may extend from the first region R1 toward the second region R2. The first and second trenches TR1 and TR2 may have widths in the second direction D2 that decrease with increasing distance from the first substrate 10.

A first separation pattern SP1 may be provided to fill the first trench TR1, and second separation patterns SP2 may be provided to fill the second trenches TR2. In some embodiments, there may be multiple trenches TR1 and TR2, and thus multiple first and second separation patterns SP1 and SP2. The first and second separation patterns SP1 and SP2 may have plate shapes that extend in the first and third directions D1 and D3. The second separation pattern(s) SP2 may correspond to the separation structure(s) 4230 of FIG. 3 or 4. The first and second separation patterns SP1 and SP2 may include a dielectric material, such as silicon oxide.

When the stack structure ST is provided in plural, one of the second separation patterns SP2 may be provided between the stack structures ST that are arranged along the second direction D2. For example, the stack structures ST may be spaced apart from each other across one of the second separation patterns SP2. Each of the first and second separation patterns SP1 and SP2 may be provided in plural, and the plurality of first separation patterns SP1 and the plurality of second separation patterns SP2 may be spaced apart from each other in the second direction D2.

Figure 8:
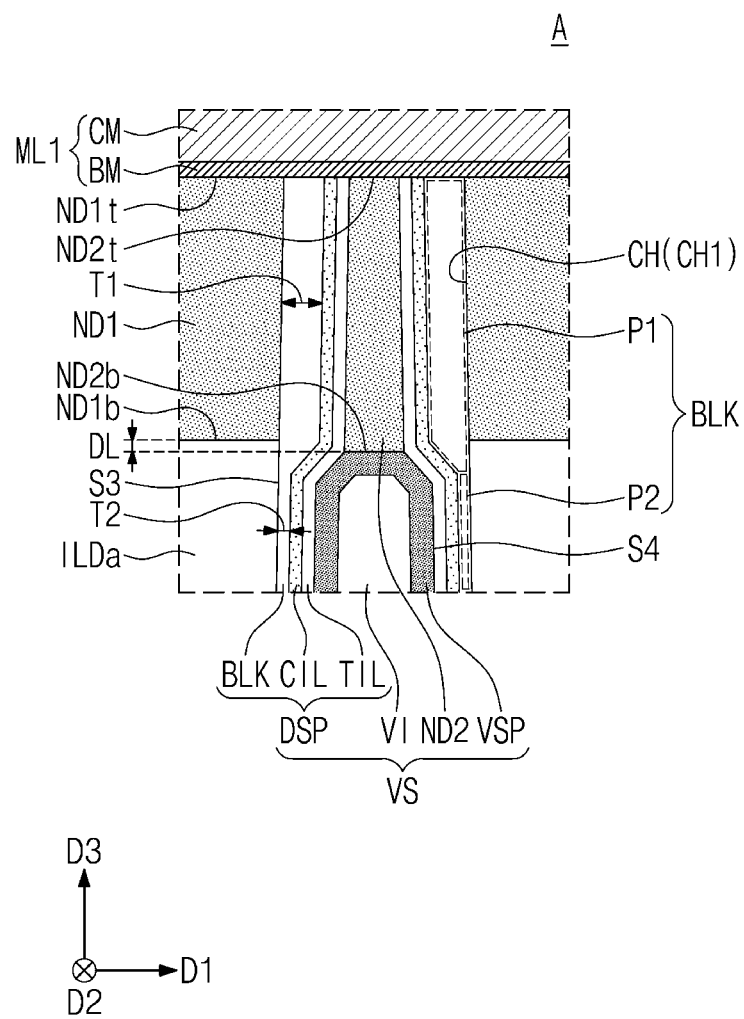
FIG. 8 illustrates an enlarged view of section A depicted in FIG. 6, partially showing a portion of a three-dimensional semiconductor memory device according to some embodiments of the present disclosure.

FIG. 8 illustrates an enlarged view of section A depicted in FIG. 6, partially showing a three-dimensional semiconductor memory device according to some embodiments of the present disclosure.

Referring to FIGS. 6 and 8, there may be illustrated one of the vertical channel structures VS each including the first metal layer ML1, the first source conductive pattern ND1, the data storage pattern DSP, the vertical semiconductor pattern VSP, the buried dielectric pattern VI, and the second source conductive pattern ND2. For convenience of description, the following will discuss a single vertical channel hole CH and a single vertical channel structure VS, and this discussion may also be identically applicable to other vertical channel holes CH and other vertical channel structures VS.

The vertical channel structure VS may have a top surface in contact with the first metal layer ML1. The top surface of the vertical channel structure VS may correspond to a top surface ND2$t$ of the second source conductive pattern ND2, and may be substantially coplanar with a top surface ND1$t$ of the first source conductive pattern ND1. The first source conductive pattern ND1 may have a bottom surface ND1$b$ located for example at a higher level than that of a bottom surface ND2$b$ of the second source conductive pattern ND2. A range of about one (1) nanometer (nm) to about ten (10) nm may be given as a level difference DL between the bottom surface ND1$b$ of the first source conductive pattern ND1 and the bottom surface ND2$b$ of the second source conductive pattern ND2. This, however, is merely exemplary, and the present disclosure is not limited thereto. The bottom surface ND1$b$ of the first source conductive pattern ND1 may be located at a lower level than that of the bottom surface ND2$b$ of the second source conductive pattern ND2.

The data storage pattern DSP may include a blocking dielectric layer BLK, a charge storage layer CIL, and a tunneling dielectric layer TIL that are sequentially stacked on an inner sidewall S3 of the vertical channel hole CH. The blocking dielectric layer BLK may be adjacent to a sidewall of the stack structure ST or a sidewall of the first source conductive pattern ND1, and the tunneling dielectric layer TIL may be adjacent to a sidewall of the vertical semiconductor pattern VSP or a sidewall of the second source conductive pattern ND2. The charge storage layer CIL may be interposed between the blocking dielectric layer BLK and the tunneling dielectric layer TIL. The blocking dielectric layer BLK, the charge storage layer CIL, and the tunneling dielectric layer TIL may extend in the third direction D3 between the stack structure ST and the vertical semiconductor pattern VSP and between the first source conductive pattern ND1 and the second source conductive pattern ND2.

The blocking dielectric layer BLK may include a first portion P1 that is adjacent to the sidewall of the first source conductive pattern ND1 and a second portion P2 that is interposed between the vertical semiconductor pattern VSP and the stack structure ST. The first portion P1 may have a thickness T1 in the first direction D1 that is greater than a thickness T2 in the first direction D1 of the second portion P2. The thickness T2 of the second portion P2 may range, for example, from about 1 nm to about 10 nm. The thickness T1 of the first portion P1 may be, for example, about 1.5 times to about two (2) times the thickness T2 of the second portion P2.

The data storage pattern DSP may store and/or change data by using Fowler-Nordheim tunneling induced by a voltage difference between the vertical semiconductor pattern VSP and the first and second gate electrodes ELa and ELb. For example, the blocking dielectric layer BLK and the tunneling dielectric layer TIL may include silicon oxide, and the charge storage layer CIL may include silicon nitride or silicon oxynitride.

The first metal layer ML1 may include a barrier pattern BM and a conductive pattern CM. The barrier pattern BM may be interposed between the conductive pattern CM and the first source conductive pattern ND1 and between the conductive pattern CM and the vertical channel structure VS. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer. The conductive pattern CM may include metal, such as copper (Cu), tungsten (W), aluminum (Al), nickel (Ni), or tin (Sn). The second metal layer ML2 may be formed simultaneously with the first metal layer ML1 and may have the same structure as that of the first metal layer ML1.

The second source conductive pattern ND2 may be surrounded by the tunneling dielectric layer TIL of the data storage pattern DSP, the vertical semiconductor pattern VSP, and the barrier pattern BM of the first metal layer ML1. The second source conductive pattern ND2 may have a thickness in the third direction D3 greater than a thickness in the third direction D3 of the first source conductive pattern ND1.

Figure 9:
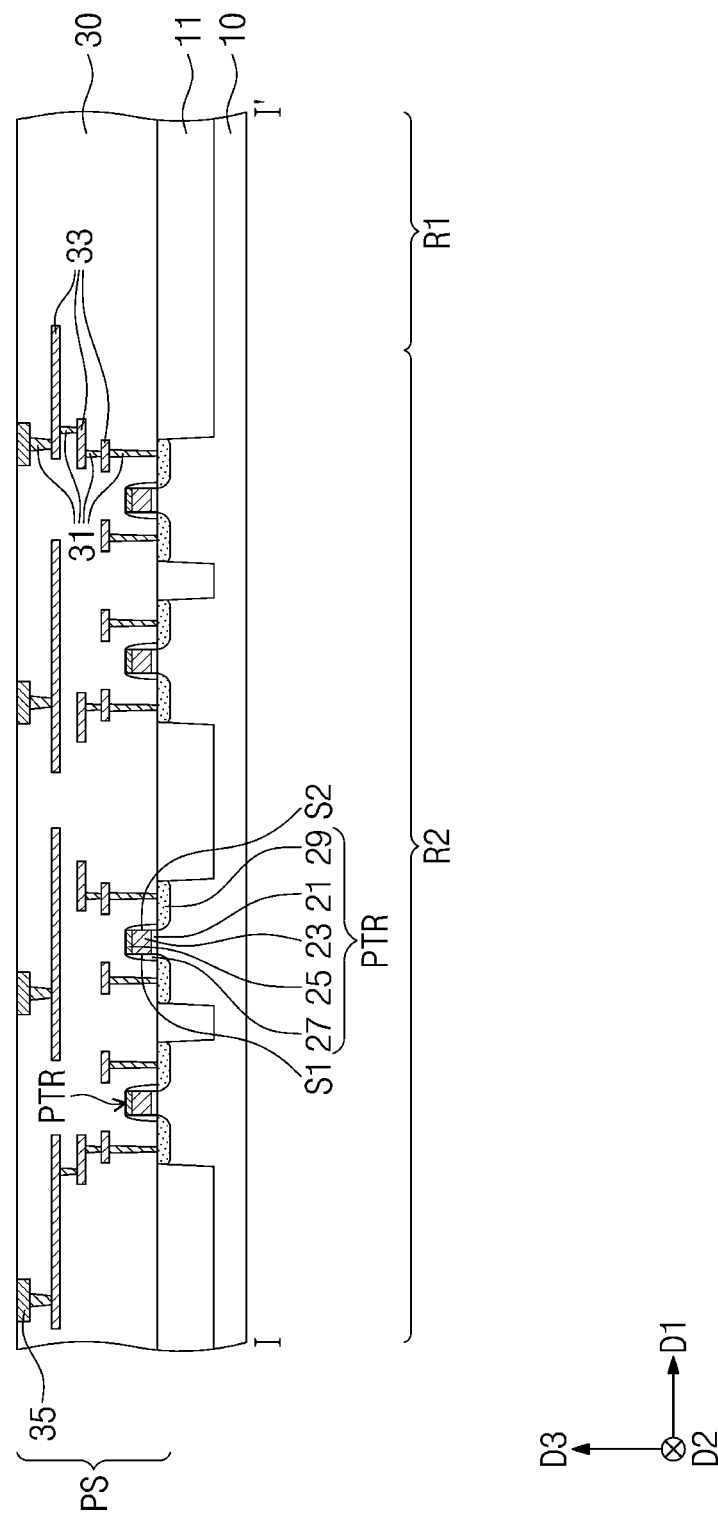
FIG. 9 illustrates a cross-sectional view taken along line I-I' of FIG. 5, showing a method of fabricating a three-dimensional semiconductor memory device according to some embodiments of the present disclosure.
Figure 10:
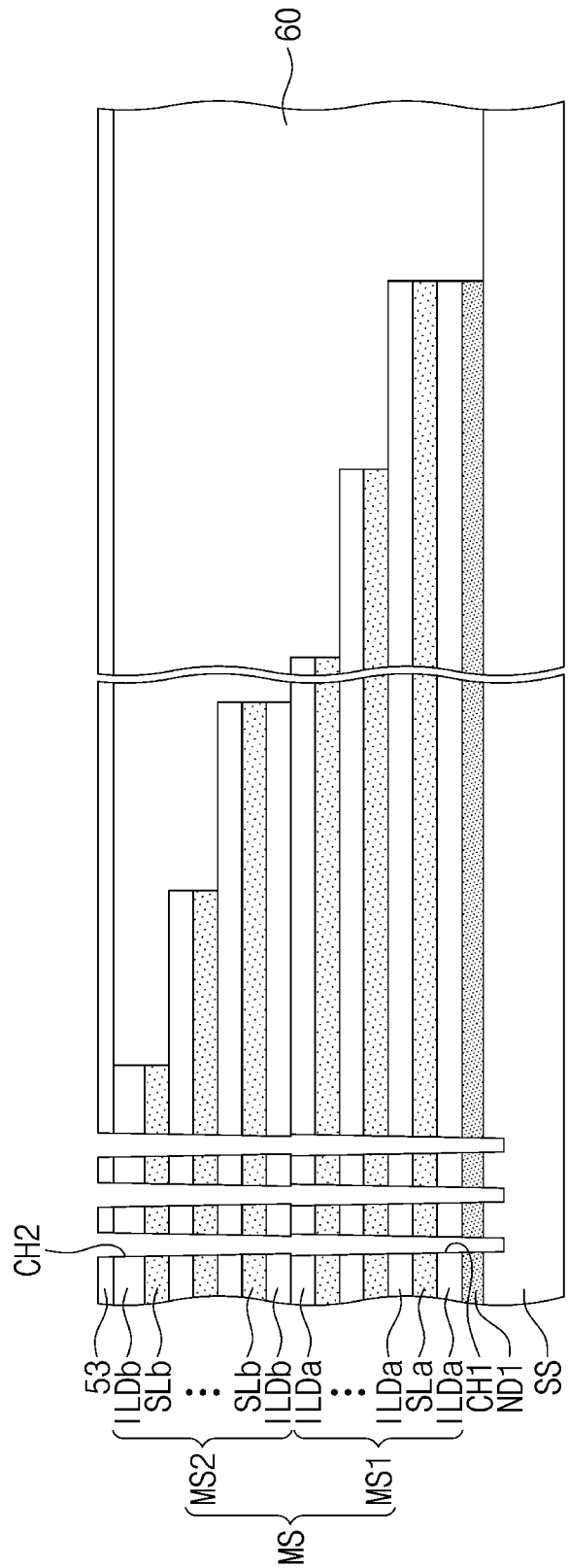
FIGS. 10 and 11 illustrate cross-sectional views showing a method of fabricating a three-dimensional semiconductor memory device according to some embodiments of the present disclosure.
Figure 11:
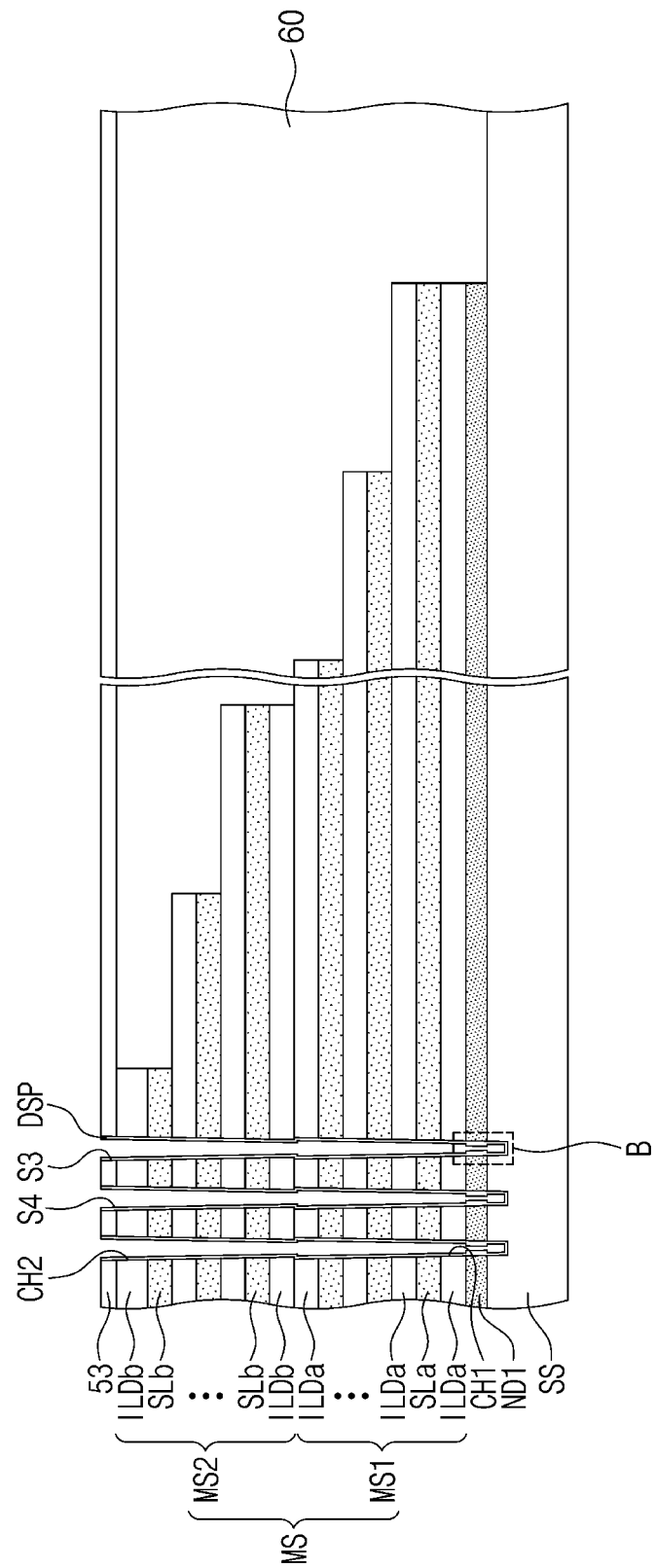
Figure 16:
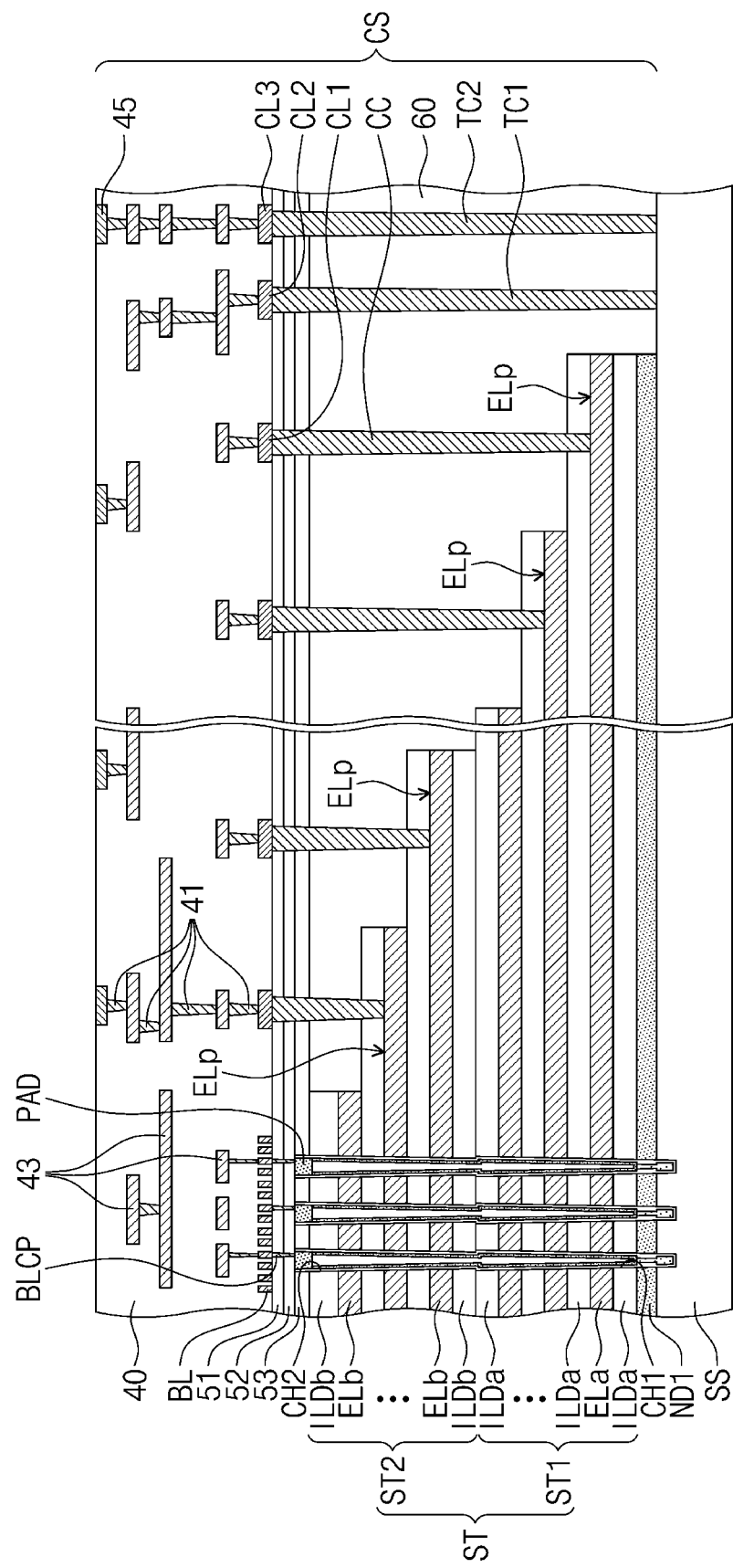
FIGS. 16 and 17 illustrate cross-sectional views showing a method of fabricating a three-dimensional semiconductor memory device according to some embodiments of the present disclosure.
Figure 17:
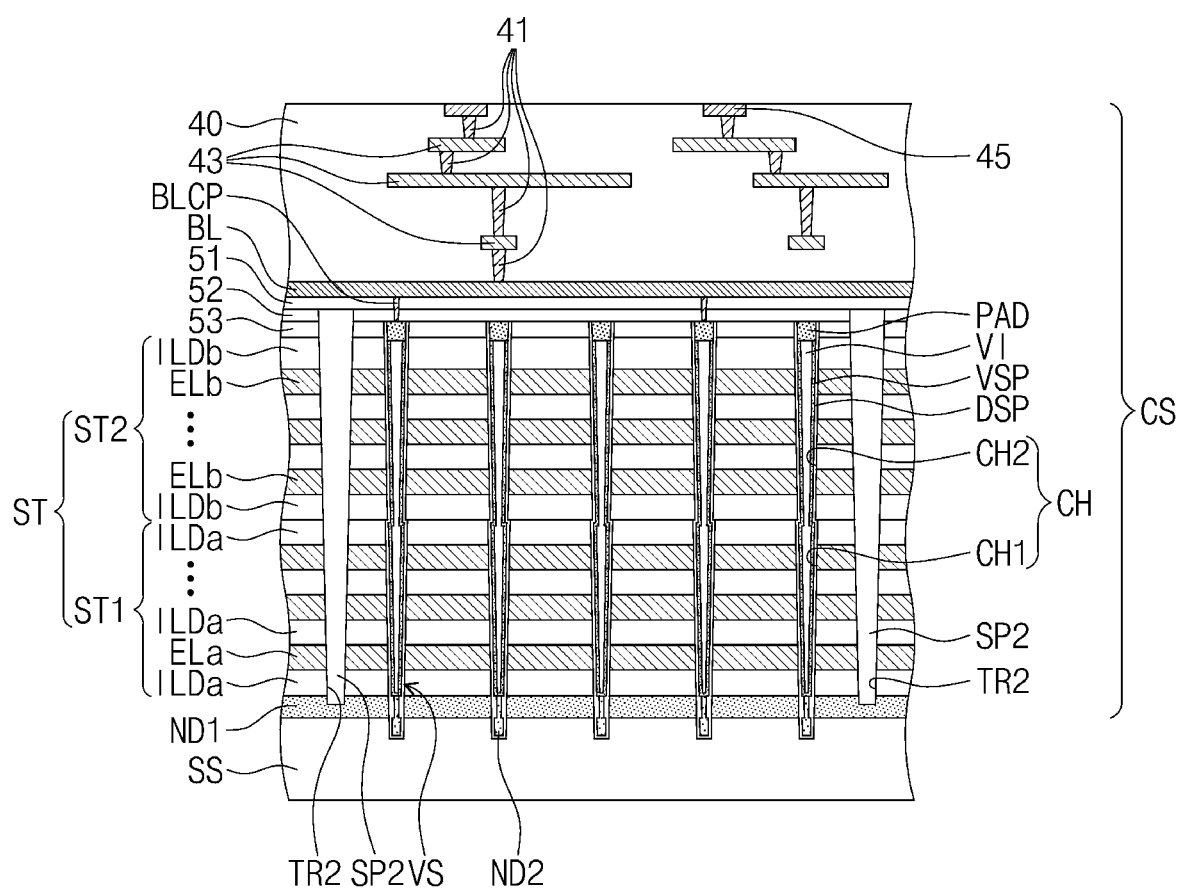
Figure 18:
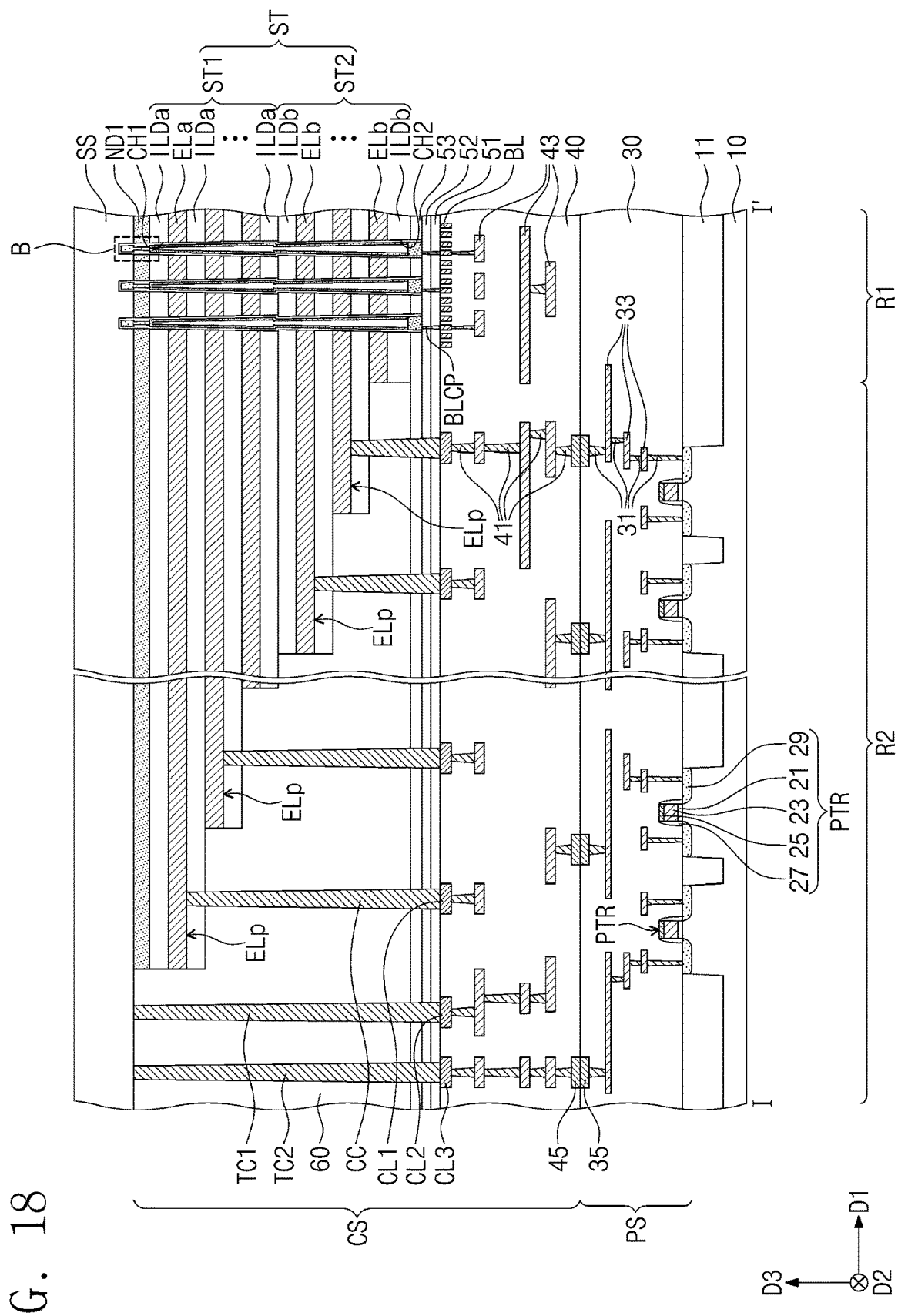
FIG. 18 illustrates a cross-sectional view taken along line I-I' of FIG. 5, showing a method of fabricating a three-dimensional semiconductor memory device according to some embodiments of the present disclosure.
Figure 19:
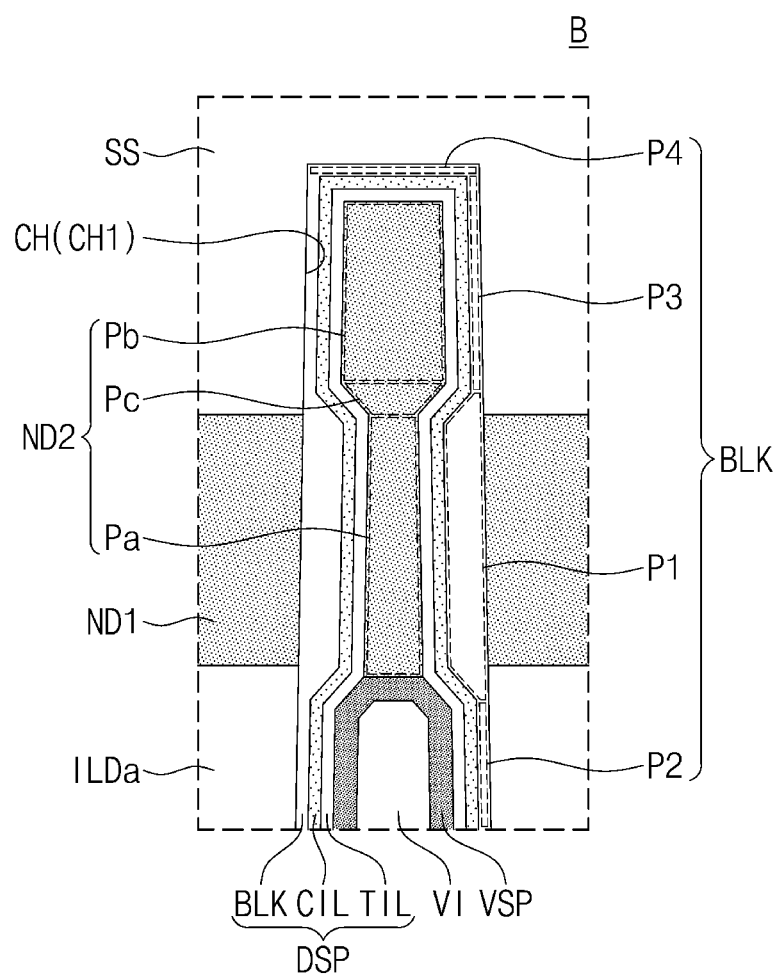
FIG. 19 illustrates an enlarged view of section B depicted in FIG. 18, showing a method of fabricating a three-dimensional semiconductor memory device according to some embodiments of the present disclosure.

FIG. 9 illustrates a cross-sectional view taken along line I-I' of FIG. 5, showing a method of fabricating a three-dimensional semiconductor memory device according to some embodiments of the present disclosure. FIGS. 10 and 11 illustrate cross-sectional views showing a method of fabricating a three-dimensional semiconductor memory device according to some embodiments of the present disclosure. FIGS. 12, 13, 14, and 15 illustrate enlarged views of section B depicted in FIG. 11, showing a method of fabricating a three-dimensional semiconductor memory device according to some embodiments of the present disclosure. FIGS. 16 and 17 illustrate cross-sectional views showing a method of fabricating a three-dimensional semiconductor memory device according to some embodiments of the present disclosure. FIG. 18 illustrates a cross-sectional view taken along line I-I' of FIG. 5, showing a method of fabricating a three-dimensional semiconductor memory device according to some embodiments of the present disclosure. FIG. 19 illustrates an enlarged view of section B depicted in FIG. 18, showing a method of fabricating a three-dimensional semiconductor memory device according to some embodiments of the present disclosure.

With reference to FIGS. 9 to 19, the following will describe a method of fabricating the three-dimensional semiconductor memory device discussed in conjunction with FIGS. 5, 6, 7, and 8.

Referring to FIG. 9, a peripheral circuit structure PS may be formed on a first substrate 10. The formation of the peripheral circuit structure PS may include: forming a device isolation layer 11 in the first substrate 10; forming peripheral transistors PTR on an active section defined by the device isolation layer 11 of the first substrate 10; forming peripheral contact plugs 31, peripheral circuit lines 33, and first bonding pads 35 electrically connected to the peripheral transistors PTR; and forming a first insulating layer 30 on the device isolation layer 11, the peripheral transistors PTR, the peripheral contact plugs 31, the peripheral circuit lines 33, and the first bonding pads 35. Each of the peripheral transistors PTR may be formed having a peripheral gate dielectric layer 21, a peripheral gate electrode 23, a peripheral capping pattern 25, a peripheral gate spacer 27, and peripheral source/drain sections 29. The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover sidewalls S1 and S2 of the peripheral gate dielectric layer 21, the peripheral gate electrode 23, and the peripheral capping pattern 25. The peripheral source/drain sections 29 may be provided in the first substrate 10 adjacent to opposite sides of the peripheral gate electrode 23.

The first bonding pads 35 may have top surfaces substantially coplanar with that of the first insulating layer 30. In this description below, the phrase "substantially coplanar with" may mean that a planarization process can be performed. The planarization process may be, for example, a chemical mechanical polishing (CMP) process or an etch-back process.

Referring to FIG. 10, a sacrificial substrate SS may be provided. The sacrificial substrate SS may be, for example, a silicon substrate, but the present disclosure is not limited thereto.

A first source conductive pattern ND1 may be formed on the sacrificial substrate SS. The first source conductive pattern ND1 may be formed of a semiconductor material doped with impurities having a first conductivity type (e.g., n-type).

A mold structure MS may be formed on the first source conductive pattern ND1, which mold structure MS includes first and second interlayer dielectric layers ILDa and ILDb and first and second sacrificial layers SLa and SLb. The formation of the mold structure MS may include: forming a first mold structure MS1 including the first interlayer dielectric layers ILDa and the first sacrificial layers SLa that are alternately stacked on the first source conductive pattern ND1; forming first vertical channel holes CH1 that penetrate the first mold structure MS1 and the first source conductive pattern ND1; filling the first vertical channel holes CH1 with a sacrificial material; forming a second mold structure MS2 including the second interlayer dielectric layers ILDb and the second sacrificial layers SLb that are alternately stacked on the first mold structure MS1; forming second vertical channel holes CH2 that penetrate a fifth insulating layer 53 and the second mold structure MS2; and removing the sacrificial material in the first vertical channel holes CH1, wherein the sacrificial material is exposed to the second vertical channel holes CH2. The second vertical channel holes CH2 may overlap in a vertical direction with the first vertical channel holes CH1 and may be spatially connected to the first vertical channel holes CH1.

The first and second sacrificial layers SLa and SLb may be formed of a dielectric material different from that of the first and second interlayer dielectric layers ILDa and ILDb. The first and second sacrificial layers SLa and SLb may be formed of a material having an etch selectivity with respect to the first and second interlayer dielectric layers ILDa and ILDb. For example, the first and second sacrificial layers SLa and SLb may be formed of silicon nitride, and the first and second interlayer dielectric layers ILDa and ILDb may be formed of silicon oxide.

A trimming process may be performed on the mold structure MS including the first and second interlayer dielectric layers ILDa and ILDb and the first and second sacrificial layers SLa and SLb that are alternately stacked. The trimming process may include a first trimming process that is performed before the formation of the first vertical channel holes CH1 and a second trimming process that is performed after the formation of the second vertical channel holes CH2.

The trimming process may include: forming a mask pattern that partially covers a top surface of the first mold structure MS1 or the second mold structure MS2; using the mask pattern to pattern the first mold structure MS1 or the second mold structure MS2; reducing an area of the mask pattern; and using the reduced mask pattern to pattern the first mold structure MS1 or the second mold structure MS2. The step of reducing the area of the mask pattern may be performed repeatedly and alternately with the step of using the mask pattern to pattern the first mold structure MS1 or the second mold structure MS2. The trimming process may externally expose at least a portion of each of the first and second interlayer dielectric layers ILDa and ILDb, and may form a stepwise structure of the mold structure MS.

Afterwards, a sixth insulating layer 60 may be formed on the step structure of the mold structure MS. The sixth insulating layer 60 may be on at least a portion of the sacrificial substrate SS. The sixth insulating layer 60 may have a top surface that is substantially flat, and the top surface of the sixth insulating layer 60 may be substantially coplanar with that of an uppermost one of the second interlayer dielectric layers ILDb included in the second mold structure MS2.

In the following description with reference to FIGS. 9 to 17, the term "top surface" may indicate "bottom surface" of the three-dimensional semiconductor memory device that has been fabricated as discussed in conjunction with FIGS. 6, 7, and 8, and the term "bottom surface" may denote "top surface" of the three-dimensional semiconductor memory device that has been fabricated as discussed in conjunction with FIGS. 6, 7, and 8.

Figure 12:
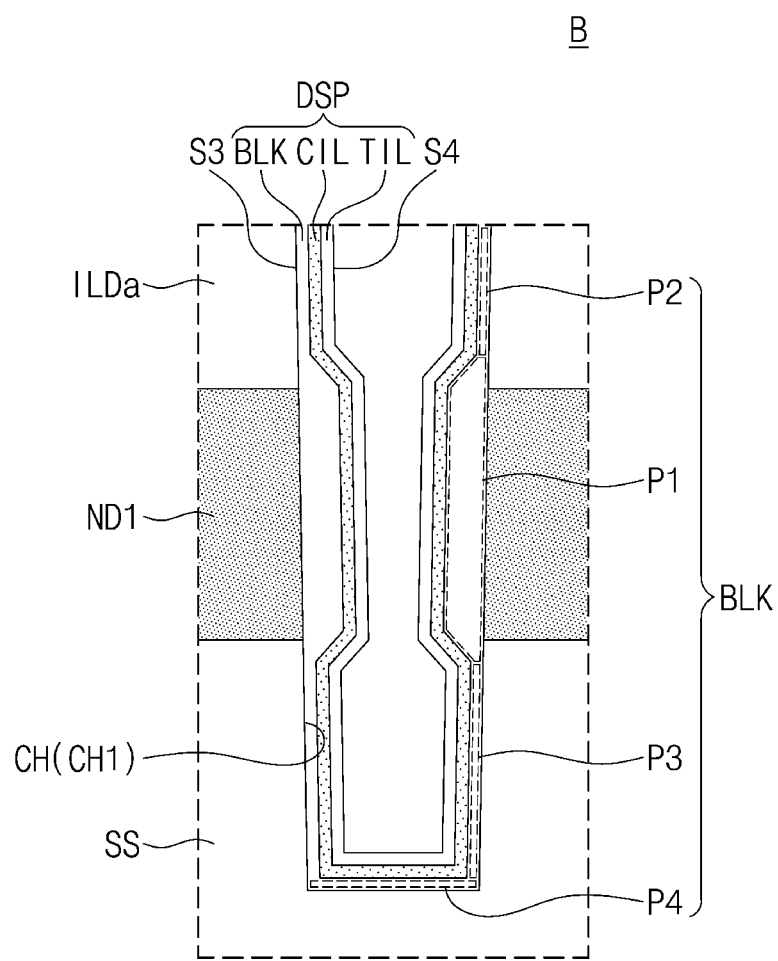
FIGS. 12, 13, 14, and 15 illustrate enlarged views of section B depicted in FIG. 11, showing a method of fabricating a three-dimensional semiconductor memory device according to some embodiments of the present disclosure.

Referring to FIGS. 11 and 12, a data storage pattern DSP may conform to, and be on, an inner sidewall S3 of each of the first and second vertical channel holes CH1 and CH2. The formation of the data storage pattern DSP may include sequentially forming a blocking dielectric layer BLK, a charge storage layer CIL, and a tunneling dielectric layer TIL on the inner sidewall S3 of each of the first and second vertical channel holes CH1 and CH2. The formation of the blocking dielectric layer BLK may include an oxidation process and a deposition process. The oxidation process may cause the blocking dielectric layer BLK adjacent to the first source conductive pattern ND1 to be deposited relatively thick.

For example, the blocking dielectric layer BLK may include first, second, and third portions P1, P2, and P3 on an inner sidewall S3 of each of the first and second vertical channel holes CH1 and CH2, and may also include a fourth portion P4 on a bottom surface of each of the first vertical channel holes CH1. The first portion P1 of the blocking dielectric layer BLK may be a portion adjacent to the first source conductive pattern ND1. The second portion P2 of the blocking dielectric layer BLK may be a portion on the inner sidewall S3 of each of the first and second vertical channel holes CH1 and CH2 (or an inner sidewall of the mold structure MS), wherein the sidewall is located at a higher level than that of the first source conductive pattern ND1. The third portion P3 of the blocking dielectric layer BLK may be a portion on the inner sidewall S3 of each of the first and second vertical channel holes CH1 and CH2, wherein the sidewall is located at a lower level than that of the first source conductive pattern ND1 (or an inner sidewall of the sacrificial substrate SS). The oxidation process may allow the first portion P1 adjacent to the first source conductive pattern ND1 to have a thickness greater than the thickness(es) of the second, third, and fourth portions P2, P3, and P4. The charge storage layer CIL and the tunneling dielectric layer TIL may have thicknesses that are substantially uniform.

Figure 13:
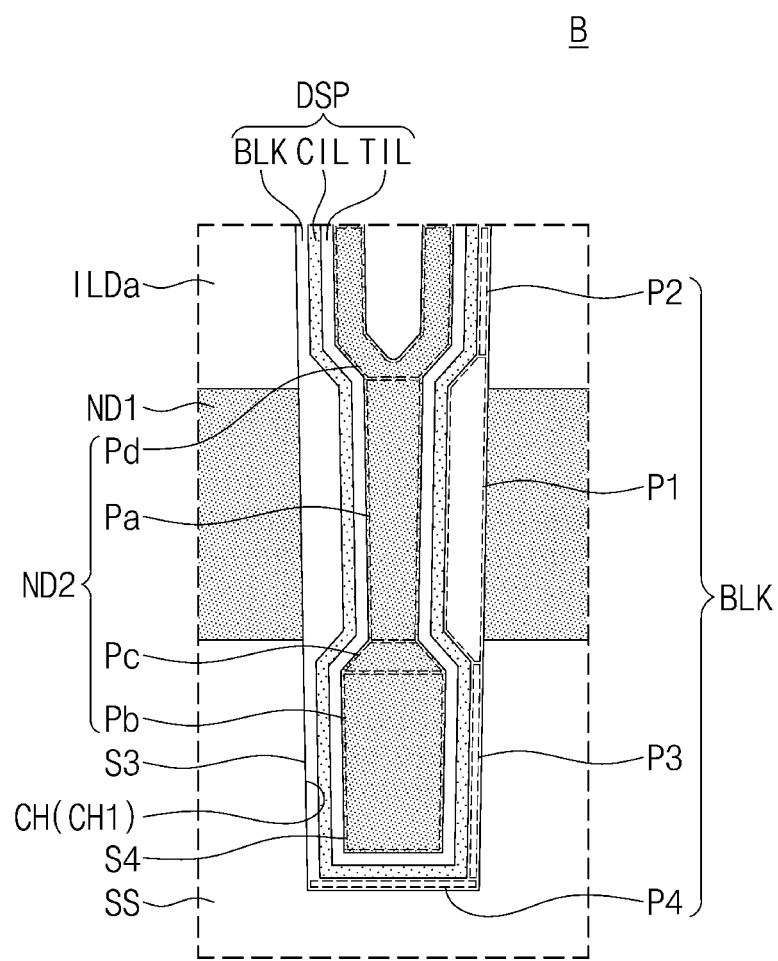

Referring to FIGS. 11 and 13, a second source conductive pattern ND2 may be formed to fill each of the first and second vertical channel holes CH1 and CH2. The second source conductive pattern ND2 may fill a space surrounded by the first, third, and fourth portions P1, P3, and P4 of the blocking dielectric layer BLK, and may conform to, and be on, an inner sidewall S4 of the data storage pattern DSP surrounded by the second portion P2 of the blocking dielectric layer BLK.

For example, the second source conductive pattern ND2 may include a first portion Pa that is surrounded by the first portion P1 of the blocking dielectric layer BLK and is adjacent to the first source conductive pattern ND1, a second portion Pb that is surrounded by the third and fourth portions P3 and P4 of the blocking dielectric layer BLK, a third portion Pc between the first portion Pa and the second portion Pb, and a fourth portion Pd that is provided on the first portion Pa and is surrounded by the second portion P2 of the blocking dielectric layer BLK.

Each of the first and second portions Pa and Pb of the second source conductive pattern ND2 may have a width in a horizontal direction that increases with increasing distance from a bottom surface of the sacrificial substrate SS, and the third portion Pc of the second source conductive pattern ND2 may have a width in the horizontal direction that decreases with increasing distance from the bottom surface of the sacrificial substrate SS. The second and third portions Pb and Pc of the second source conductive pattern ND2 may be located at a lower level than that of a bottom surface of the first source conductive pattern ND1 (or a top surface of the sacrificial substrate SS). The fourth portion Pd of the second source conductive pattern ND2 may conformally conform to, and be on, the inner sidewall S4 of the data storage pattern DSP surrounded by the second portion P2 of the blocking dielectric layer BLK.

Figure 14:
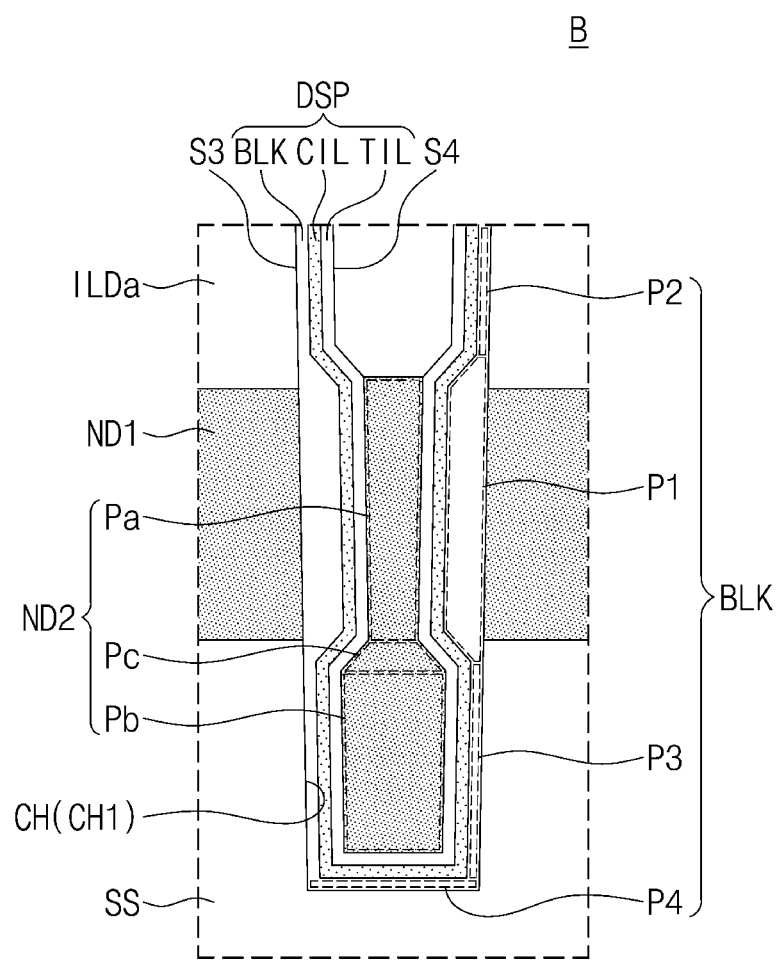

Referring to FIGS. 11, 13, and 14, there may be removed a portion of the second source conductive pattern ND2 that fills at least a portion of each of the first and second vertical channel holes CH1 and CH2. For example, the fourth portion Pd of the second source conductive pattern ND2 may be removed, and the first, second, and third portions Pa, Pb, and Pc of the second source conductive pattern ND2 may remain. The remaining first portion Pa of the second source conductive pattern ND2 may have a top surface located at a level higher than that of a top surface of the first source conductive pattern ND1 and lower than that of a top surface of the first part P1 of the blocking dielectric layer BLK, but this is merely exemplary and the present disclosure is not limited thereto.

Figure 15:
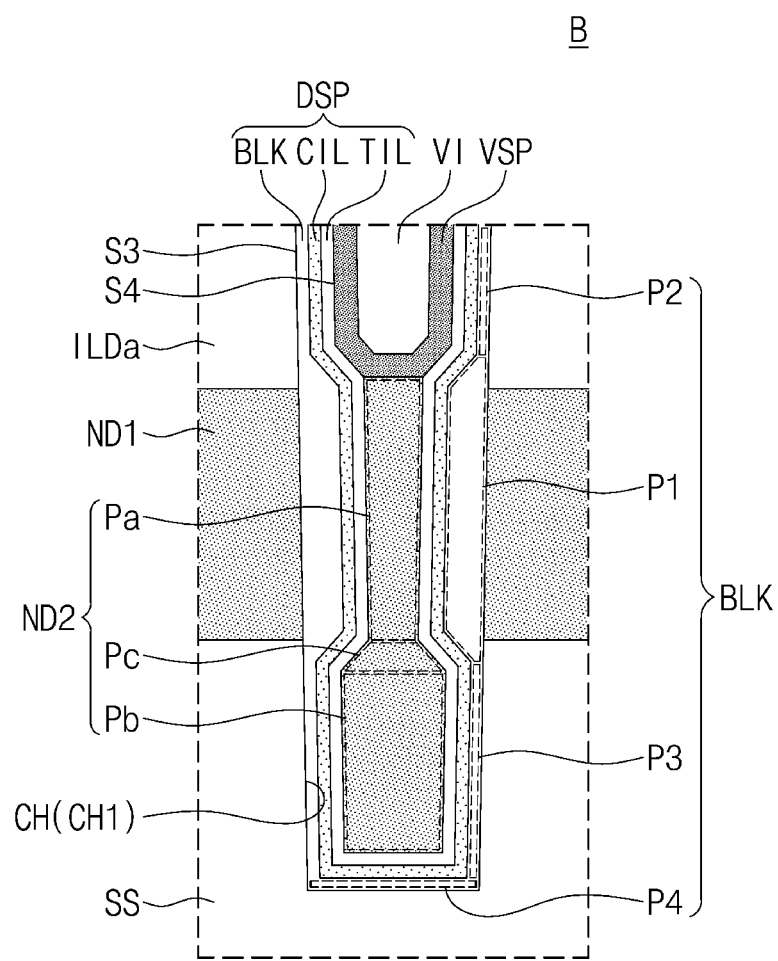

Referring to FIGS. 11, 14, and 15, a vertical semiconductor pattern VSP and a buried dielectric pattern VI may be formed to fill a space from which is removed a portion of the second source conductive pattern ND2. The vertical semiconductor pattern VSP may conform to, and be on, the inner sidewall S4 of the data storage pattern DSP and the top surface of the first part Pa of the second source conductive pattern ND2. The buried dielectric pattern VI may fill an inner space of each of the first and second vertical channel holes CH1 and CH2, wherein the inner space is surrounded by the vertical semiconductor pattern VSP. After that, a conductive pad (see PAD of FIG. 16 or 17) may be formed in a space surrounded by the data storage pattern DSP on the vertical semiconductor pattern VSP and the buried dielectric pattern VI.

Referring to FIGS. 11, 16, and 17, a fourth insulating layer 52 may be formed on the fifth insulating layer 53 and the vertical channel structures VS. A first trench TR1 and one or more second trench(es) TR2 may be formed to penetrate the fourth insulating layer 52, the fifth insulating layer 53, and at least a portion of the mold structure MS. One or more of the second trench(es) TR2 may further penetrate at least a portion of the first source conductive pattern ND1. The first trench TR1 may have a depth less than that of each of the second trenches TR2. Although not shown, the first trench TR1 may have a bottom surface located, for example, at a higher level than that of a top surface of an uppermost one of the first interlayer dielectric layers ILDa. One or more of the second trench(es) TR2 may have bottom surfaces located at a lower level than that of a bottom surface of a lowermost one of the first interlayer dielectric layers ILDa. The bottom surfaces of the second trenches TR2 may be located, for example, at a higher level than that of bottom surfaces of the vertical channel structures VS.

Referring to FIGS. 11, 16, and 17, the first and second sacrificial layers SLa and SLb may be selectively removed which are exposed to the second trenches TR2. The removal of the first and second sacrificial layers SLa and SLb may include performing, for example, a wet etching process that uses hydrofluoric acid (HF) and/or phosphoric acid ($H_3PO_4$).

First and second gate electrodes ELa and ELb may be formed to fill spaces where the first and second sacrificial layers SLa and SLb are removed. As a result, first and second stack structures ST1 and ST2 may be formed which include respective first and second interlayer dielectric layers ILDa and ILDb and respective first and second gate electrodes ELa and ELb.

A first separation pattern SP1 may be formed to fill the first trench TR1, and one or more second separation pattern(s) SP2 may be formed to fill the second trenches TR2. The first and second separation patterns SP1 and SP2 may have respective top surfaces substantially coplanar with that of the fourth insulating layer 52.

A third insulating layer 51 may be formed on a top surface of the fourth insulating layer 52 and the top surfaces of the first and second separation patterns SP1 and SP2.

Referring to FIGS. 16 and 17, the following may be: bit-line contact plugs BLCP that penetrate the third, fourth, and fifth insulating layers 51, 52, and 53 and correspondingly connect with the conductive pads PAD of the vertical channel structures VS; cell contacts CC that penetrate the third, fourth, fifth, and sixth insulating layers 51, 52, 53, and 60 and connect with pad parts ELp of the first and second gate electrodes ELa and ELb; and first and second through contacts TC1 and TC2 that penetrate the third, fourth, fifth, and sixth insulating layers 51, 52, 53, and 60 and contact the sacrificial substrate SS.

On the third insulating layer 51, bit lines BL may be formed to connect with the bit-line contact plugs BLCP, first conductive lines CL1 may be formed to connect with the cell contacts CC, and second and third conductive lines CL2 and CL3 may be formed to correspondingly connect with the first and second through contacts TC1 and TC2.

On the third insulating layer 51, the following may be formed: connection contact plugs 41, connection circuit lines 43, and second bonding pads 45 that are electrically connected to the bit lines BL and the first, second, and third conductive lines CL1, CL2, and CL3. A second insulating layer 40 may also be formed that surrounds at least a portion of the connection contact plugs 41, the connection circuit lines 43, and the second bonding pads 45. The second bonding pads 45 may have top surfaces substantially coplanar with that of the second insulating layer 40. Accordingly, the method discussed with reference to FIGS. 10 to 17 may form a cell array structure CS on the sacrificial substrate SS.

Referring to FIGS. 18 and 19, the cell array structure CS formed on the sacrificial substrate SS may be bonded to the peripheral circuit structure PS formed on the first substrate 10 as discussed with reference to FIG. 9. The sacrificial substrate SS may be provided on the first substrate 10 so as to allow the cell array structure CS to face the peripheral circuit structure PS. In this stage, components of the cell array structure CS may be turned upside down. The first bonding pads 35 of the peripheral circuit structure PS and the second bonding pads 45 of the cell array structure CS may be merged while being in contact with each other.

Referring back to FIGS. 6, 7, and 8 together with FIGS. 18 and 19, after the bonding of the first and second bonding pads 35 and 45 to each other, the sacrificial substrate SS may be removed from the cell array structure CS. The removal of the sacrificial substrate SS may be achieved by performing a planarization process, such as a chemical mechanical polishing (CMP) process or an etch-back process.

While the sacrificial substrate SS is removed, a portion of each of the vertical channel structures VS may also be removed. For example, the third and fourth portions P3 and P4 of the blocking dielectric layer BLK, the second and third portions Pb and Pc of the second source conductive pattern ND2, and a portion of each of the charge storage layer CIL and the tunneling dielectric layer TIL that are interposed between the blocking dielectric layer BLK and the second source conductive pattern ND2 may be removed concurrently while the sacrificial substrate SS is removed. As a result, a top surface of each of the vertical channel structure VS (or a top surface ND2t of the second source conductive pattern ND2) may become substantially coplanar with a top surface ND1t of the first source conductive pattern ND1.

Thereafter, a first metal layer ML1 may be formed on the first source conductive pattern ND1. In addition, a second metal layer ML2 may be formed on the sixth insulating layer 60. The second metal layer ML2 may be spaced apart in a horizontal direction from the first metal layer ML1. The formation of the first and second metal layers ML1 and ML2 may include forming a plurality of metal layers including different metals and barrier layers between the plurality of metal layers. A seventh insulating layer 70 may be formed on the first and second metal layers ML1 and ML2. An input/output pad TOP may be formed to penetrate the seventh insulating layer 70 and to connect with the second metal layer ML2.

Figure 20:
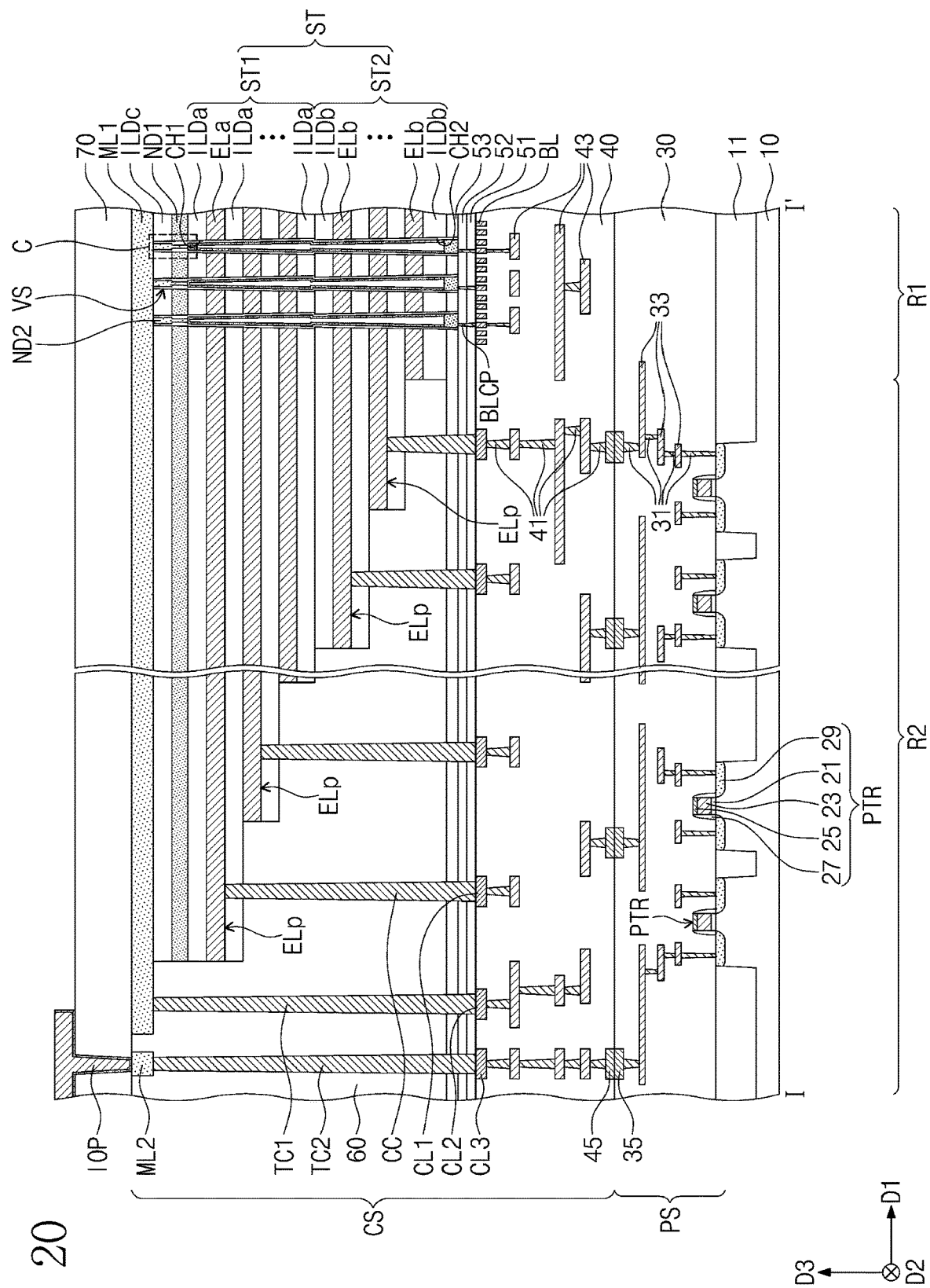
FIG. 20 illustrates a cross-sectional view taken along line I-I' of FIG. 5, showing a three-dimensional semiconductor memory device according to some embodiments of the present disclosure.
Figure 21:
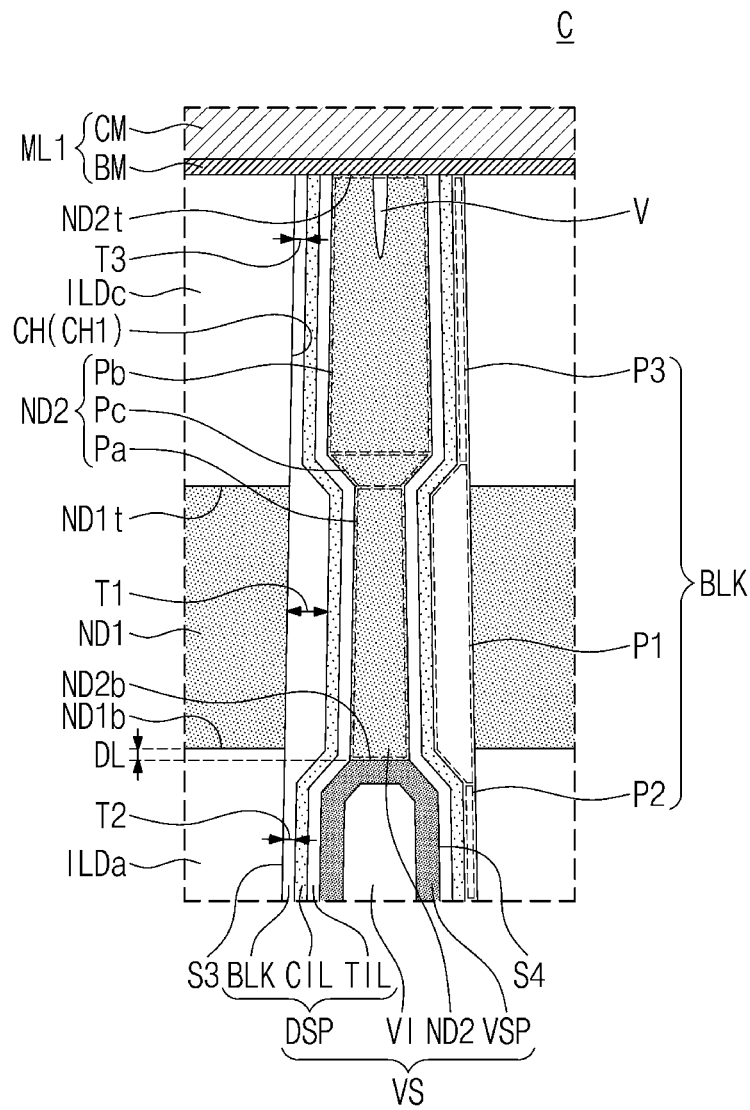
FIG. 21 illustrates an enlarged view of section C depicted in FIG. 20, partially showing a portion of a three-dimensional semiconductor memory device according to some embodiments of the present disclosure.

FIG. 20 illustrates a cross-sectional view taken along line I-I' of FIG. 5, showing a three-dimensional semiconductor memory device according to some embodiments of the present disclosure. FIG. 21 illustrates an enlarged view of section C depicted in FIG. 20, partially showing a three-dimensional semiconductor memory device according to some embodiments of the present disclosure. For convenience of description, components substantially the same as those discussed with reference to FIGS. 6, 7, and 8 will be omitted, and differences thereof will be discussed in detail.

Referring to FIGS. 20 and 21, a third interlayer dielectric layer ILDc may be interposed between the first source conductive pattern ND1 and the first metal layer ML1. The third interlayer dielectric layer ILDc may have a sidewall aligned with a sidewall of the first source conductive pattern ND1 and spaced apart from the first through contact TC1. The vertical channel structures VS may penetrate the third interlayer dielectric layer ILDc in addition to the stack structure ST and the first source conductive pattern ND1, and may contact the first metal layer ML1. The top surface ND2t of the second source conductive pattern ND2 may be located at a level higher than that of the top surface ND1t of the first source conductive pattern ND1 and substantially the same as that of a top surface of the third interlayer dielectric layer ILDc.

For example, the blocking dielectric layer BLK may include a first portion P1 adjacent to the sidewall of the first source conductive pattern ND1, a second portion P2 interposed between the vertical semiconductor pattern VSP and the stack structure ST, and a third portion P3 adjacent to the third interlayer dielectric layer ILDc. The first portion P1 may have a thickness T1 in the first direction D1 greater than a thickness T2 in the first direction D1 of the second portion P2 and greater than a thickness T3 in the first direction D1 of the third part P3. The thickness T2 of the second portion P2 and the thickness T3 of the third portion P3 may each range, for example, from about 1 nm to about 10 nm. The thickness T1 of the first portion P1 may be, for example, about 1.5 times to about 2 times the thickness T2 of the second portion P2.

The second source conductive pattern ND2 may include: a first portion Pa that is surrounded by the first portion P1 of the blocking dielectric layer BLK and is adjacent to the first source conductive pattern ND1; a second portion Pb that is surrounded by the third portion P3 of the blocking dielectric layer BLK and is adjacent to the third interlayer dielectric layer ILDc; and a third portion Pc between the first portion Pa and the second portion Pb. The first and second portions Pa and Pb of the second source conductive pattern ND2 may each have a width that decreases in the third direction D3, and the third portion Pc of the second source conductive pattern ND2 may have a width that increases in the third direction D3. The second and third portions Pb and Pc of the second source conductive pattern ND2 may be located at a higher level than that of the top surface ND1t of the first source conductive pattern ND1. The second portion Pb of the second source conductive pattern ND2 may have therein a void V in contact with the first metal layer ML1, but the present disclosure is not limited thereto and the void V may be absent in the second portion Pb of the second source conductive pattern ND2.

Figure 22:
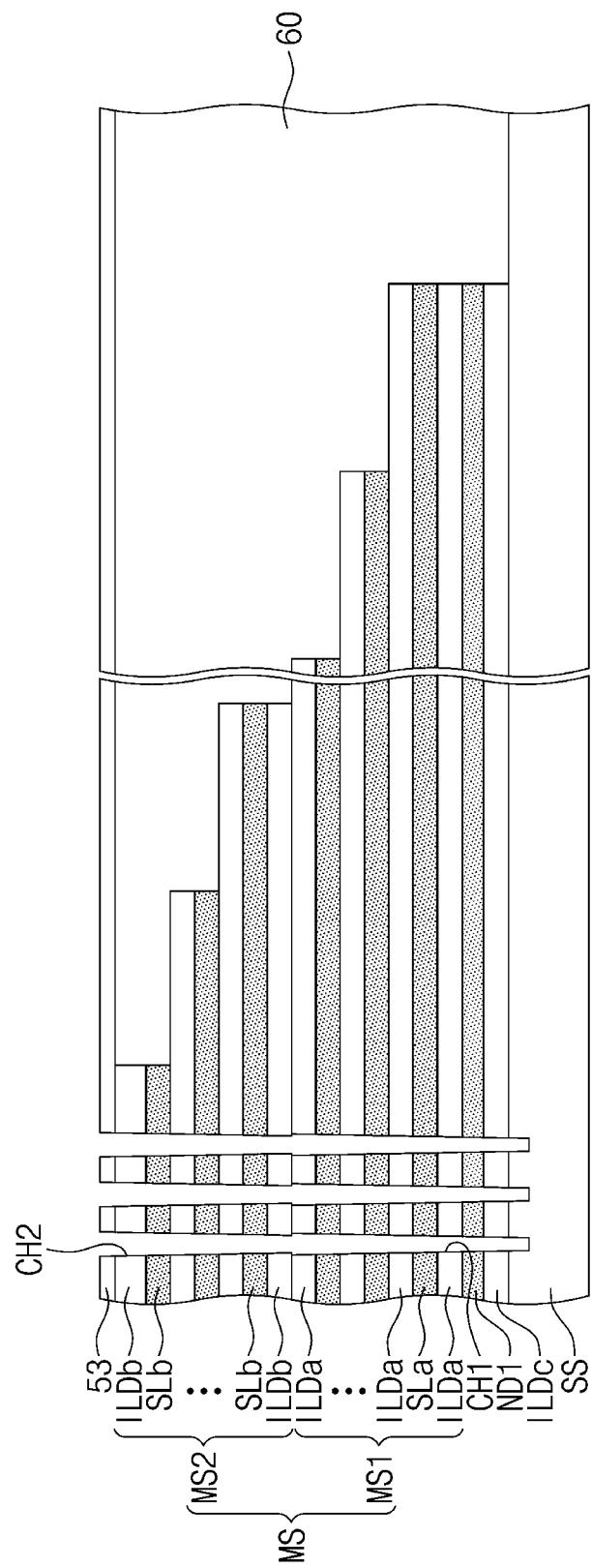
FIGS. 22 and 23 illustrate cross-sectional views showing a method of fabricating a three-dimensional semiconductor memory device according to some embodiments of the present disclosure.
Figure 23:
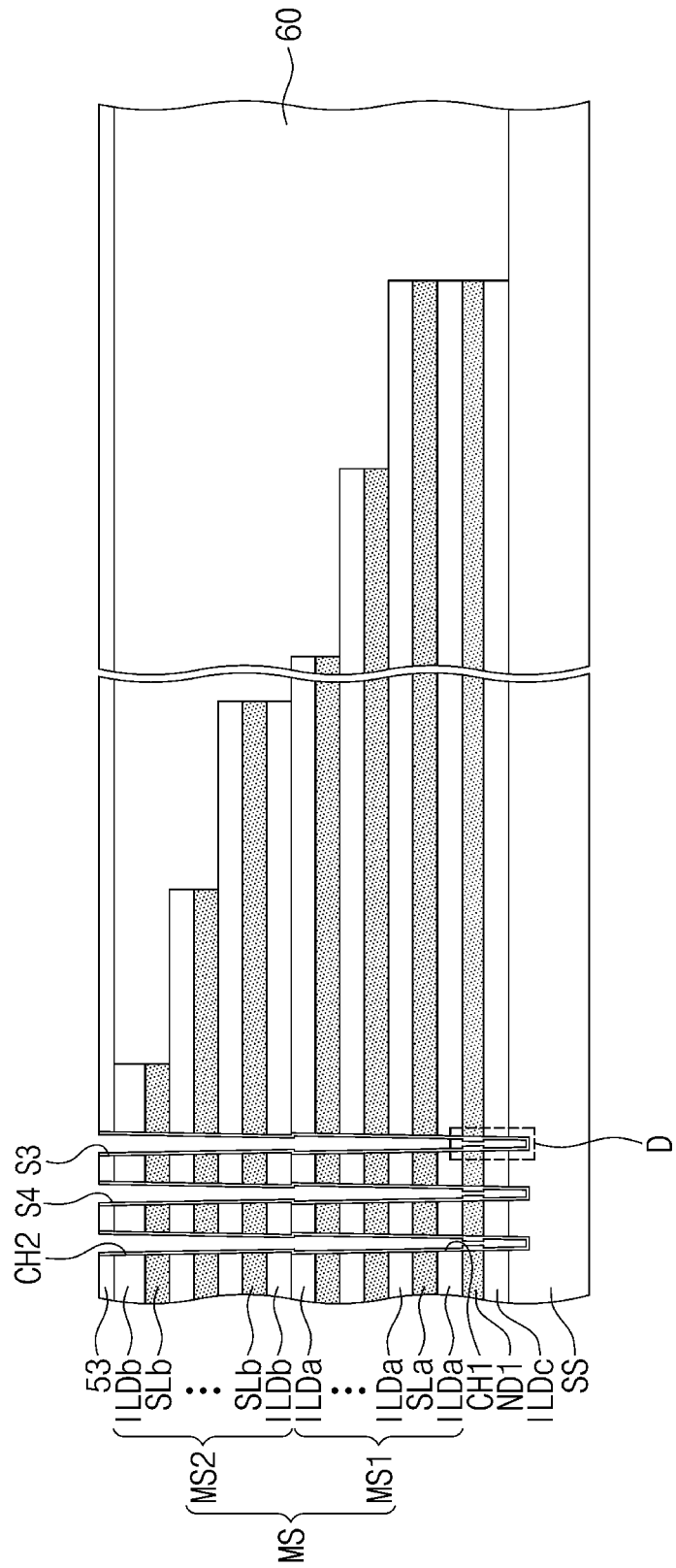

FIGS. 22 and 23 illustrate cross-sectional views showing a method of fabricating a three-dimensional semiconductor memory device according to some embodiments of the present disclosure. FIGS. 24, 25, 26, and 27 illustrate enlarged views of section D depicted in FIG. 23, showing a method of fabricating a three-dimensional semiconductor memory device according to some embodiments of the present disclosure.

With reference to FIGS. 22 to 27, the following will describe a method of fabricating the three-dimensional semiconductor memory device discussed in conjunction with FIGS. 20 and 21. However, components substantially the same as those discussed with reference to FIGS. 9 to 19 will be omitted, and differences thereof will be described in detail.

Referring to FIG. 22, the third interlayer dielectric layer ILDc may be formed on the sacrificial substrate SS. The first source conductive pattern ND1 may be formed on the third interlayer dielectric layer ILDc. The mold structure MS may be formed on the first source conductive pattern ND1. The first vertical channel holes CH1 may penetrate the first mold structure MS1, the first source conductive pattern ND1, and the third interlayer dielectric layer ILDc.

Figure 24:
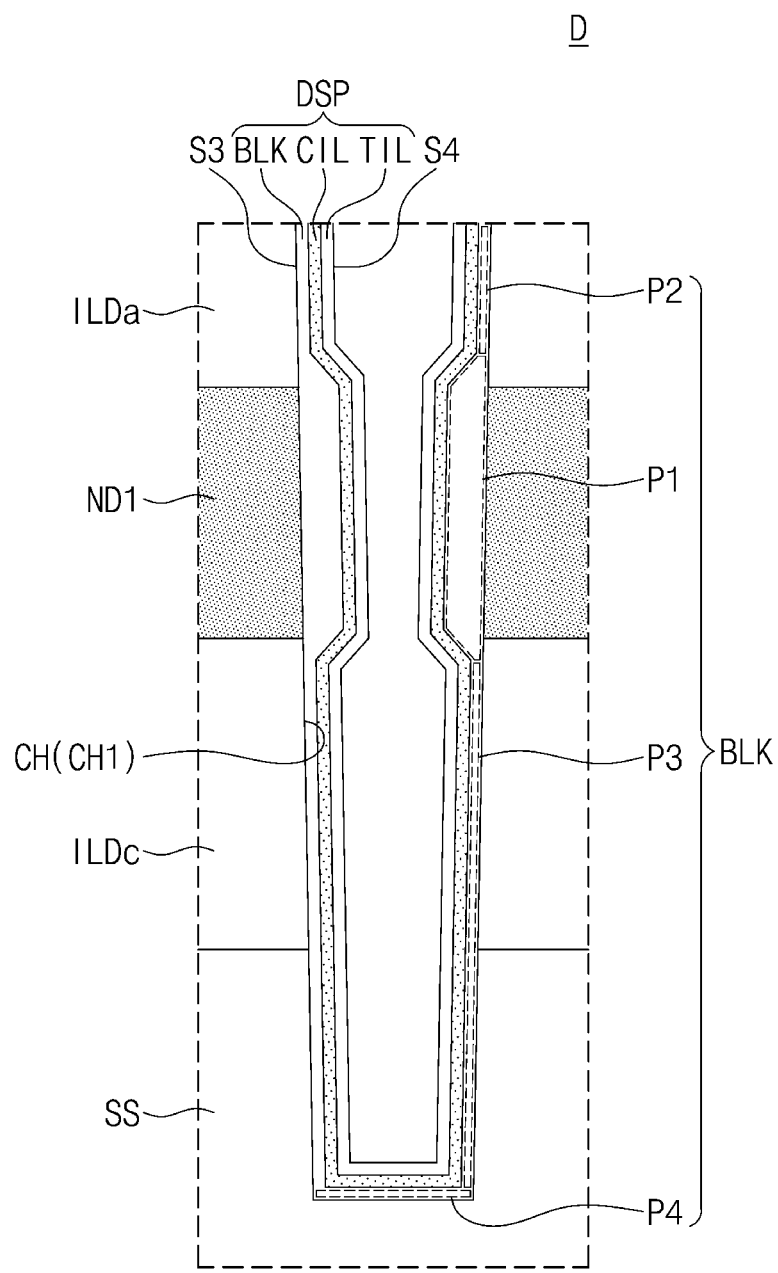
FIGS. 24, 25, 26, and 27 illustrate enlarged views of section D depicted in FIG. 23, showing a method of fabricating a three-dimensional semiconductor memory device according to some embodiments of the present disclosure.

Referring to FIGS. 23 and 24, the data storage pattern DSP may be formed to conform to, and be on, an inner sidewall S3 of each of the first and second vertical channel holes CH1 and CH2.

For example, the blocking dielectric layer BLK may include first, second, and third portions P1, P2, and P3 on the inner sidewall S3 of each of the first and second vertical channel holes CH1 and CH2 and may also include a fourth portion P4 on a bottom surface of each of the first vertical channel holes CH1. The first portion P1 of the blocking dielectric layer BLK may be a portion adjacent to the first source conductive pattern ND1, the second portion P2 of the blocking dielectric layer BLK may be a portion on the inner sidewall S3 of each of the first and second vertical channel holes CH1 and CH2 (or an inner sidewall of the mold structure MS), wherein the sidewall is located at a higher level than that of the first source conductive pattern ND1, and the third portion P3 of the blocking dielectric layer BLK may be a portion on the inner sidewall S3 of each of the first and second vertical channel holes CH1 and CH2, wherein the sidewall is located at a lower level than that of the first source conductive pattern ND1 (or an inner sidewall of the third interlayer dielectric layer ILDc and an inner sidewall of the sacrificial substrate SS). The oxidation process may cause the first portion P1 adjacent to the first source conductive pattern ND1 to have a thickness greater than those of the second, third, and fourth portions P2, P3, and P4.

Figure 25:
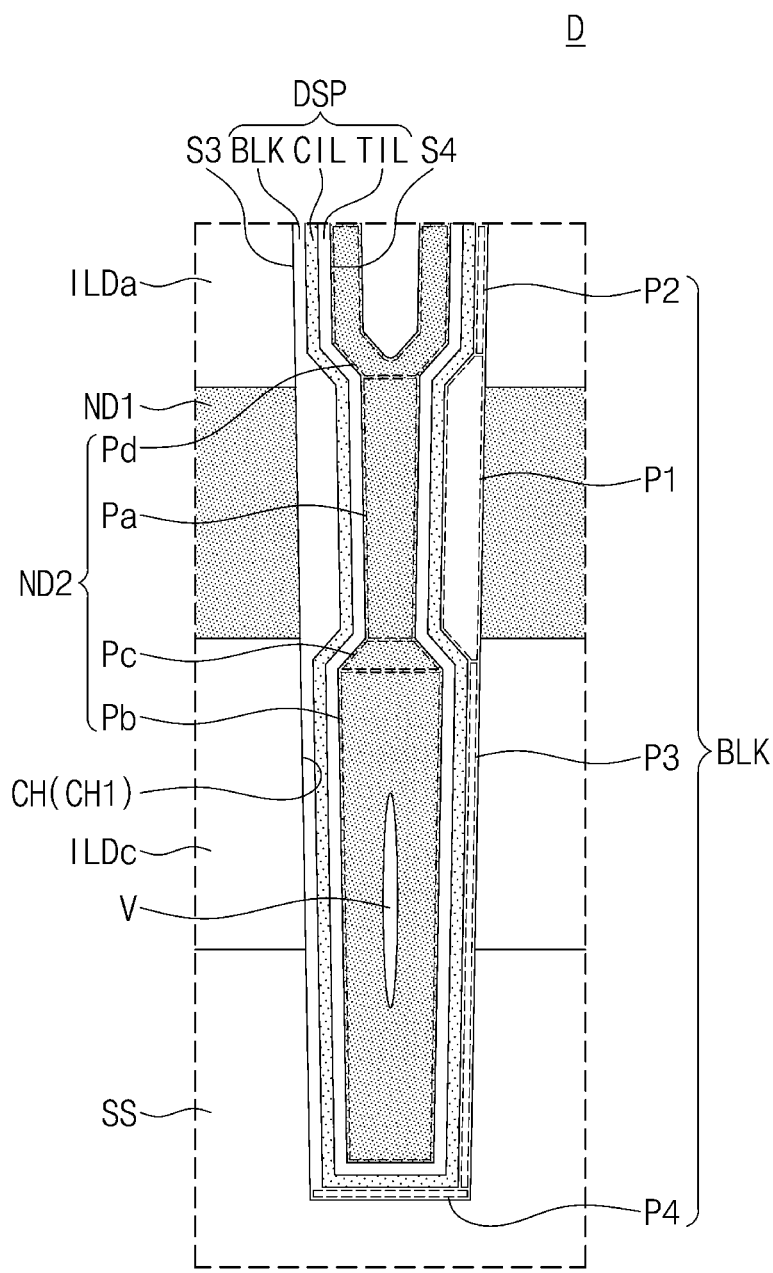

Referring to FIGS. 23 and 25, the second source conductive pattern ND2 may be formed to fill each of the first and second vertical channel holes CH1 and CH2.

For example, the second source conductive pattern ND2 may include: a first portion Pa that is surrounded by the first portion P1 of the blocking dielectric layer BLK and is adjacent to the first source conductive pattern ND1; a second portion Pb that is surrounded by the third and fourth portions P3 and P4 of the blocking dielectric layer BLK and is adjacent to the third interlayer dielectric layer ILDc and the sacrificial substrate SS; a third portion Pc between the first portion Pa and the second portion Pb; and a fourth portion Pd that is provided on the first portion Pa and is surrounded by the second portion P2 of the blocking dielectric layer BLK. The void V may be formed in the second portion Pb of the second source conductive pattern ND2.

Figure 26:
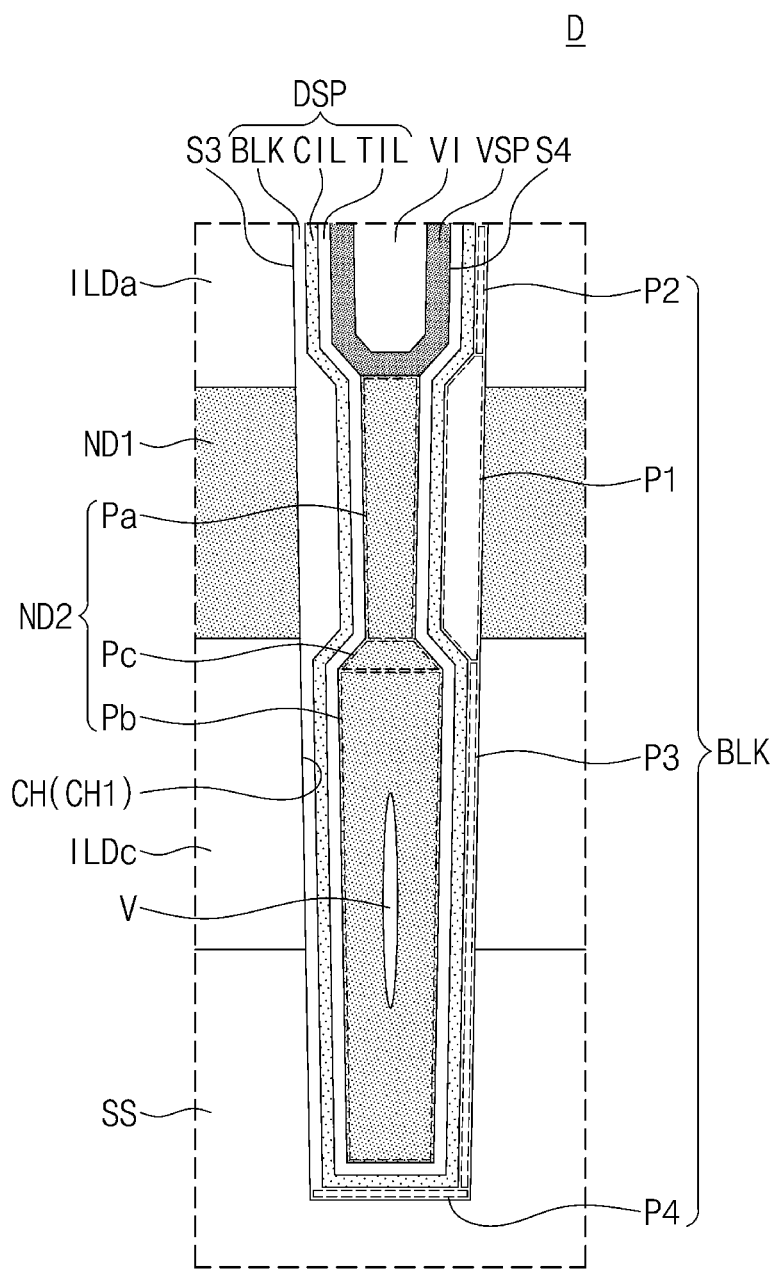

Referring to FIGS. 23, 25, and 26, there may be removed a portion of the second source conductive pattern ND2 that fill each of the first and second vertical channel holes CH1 and CH2. For example, the fourth portion Pd of the second source conductive pattern ND2 may be removed, and the first, second, and third portions Pa, Pb, and Pc of the second source conductive pattern ND2 may remain. The vertical semiconductor pattern VSP and the buried dielectric pattern VI may be formed to fill a space from which is removed a portion of the second source conductive pattern ND2.

Figure 27:
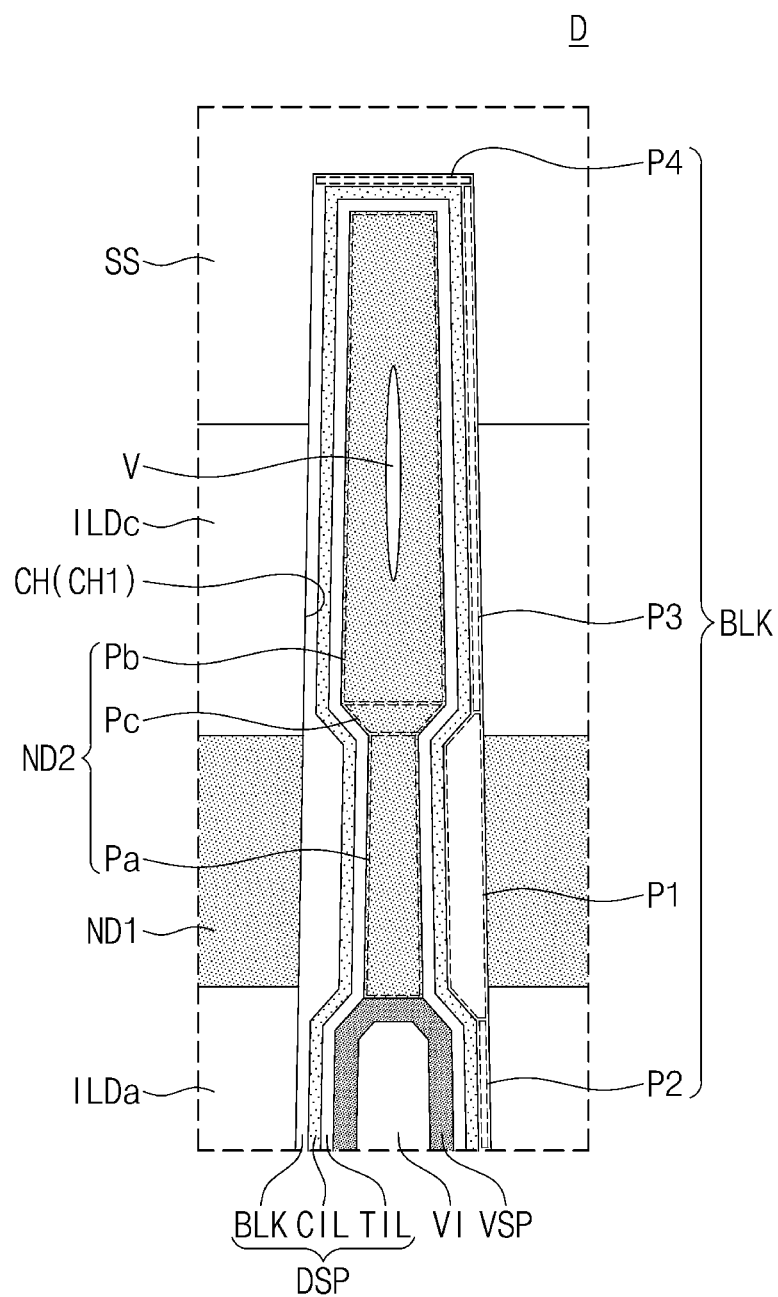

Referring to FIG. 27, components of the cell array structure CS may be turned upside down while the cell array structure CS formed on the sacrificial substrate SS and the peripheral circuit structure PS formed on the first substrate 10 are bonded to each other as discussed with reference to FIG. 18.

Referring back to FIGS. 20 and 21 together with FIG. 27, after the bonding of the first and second bonding pads 35 and 45 to each other, the sacrificial substrate SS may be removed from the cell array structure CS. A portion of each of the vertical channel structures VS that is located at a higher level than that of the top surface of the third interlayer dielectric layer ILDc may be removed concurrently while the sacrificial substrate SS is removed.

For example, the fourth portions P4 of the blocking dielectric layer BLK, a portion of the third portion P3 of the blocking dielectric layer BLK, a portion of the second portion Pb of the second source conductive pattern ND2, and a portion of each of the charge storage layer CIL and the tunneling dielectric layer TIL that are interposed between the blocking dielectric layer BLK and the second source conductive pattern ND2 may be removed concurrently while the sacrificial substrate SS is removed. As a result, the top surface of each vertical channel structure VS (or the top surface ND2$t$ of the second source conductive pattern ND2) may become substantially coplanar with the top surface of the third interlayer dielectric layer ILDc.

In contrast, differently from that shown in FIG. 27, a portion of each of the vertical channel structures VS that is located at a higher level than that of the top surface ND1$t$ of the first source conductive pattern ND1 may be removed concurrently while the sacrificial substrate SS is removed. In this case, an upper portion of each of the vertical channel structures VS may have a structure substantially the same as that discussed with reference to FIG. 8.

According to some embodiments of the present disclosure, a three-dimensional semiconductor memory device may include: a first substrate; a peripheral circuit structure on the first substrate; and a cell array structure bonded through bonding pads to the peripheral circuit structure, wherein the cell array structure may include a stack structure, a first source conductive pattern on the stack structure, and vertical channel structures that penetrate the stack structure and the first source conductive pattern. Each of the vertical channel structures may include a second source conductive pattern aligned with a vertical semiconductor pattern.

According to the present disclosure, before the peripheral circuit structure and the cell array structure are bonded to each other, the first and second source conductive patterns may be activated to prevent damage to the bonding pads and to suppress a variation in position and thickness of the second source conductive pattern, with the result that the three-dimensional semiconductor memory device may improve in reliability and electrical characteristics.

In addition, as the cell array structure is bonded onto the peripheral circuit structure, it may be possible to increase a cell capacity per unit area of the three-dimensional semiconductor memory device according to the present disclosure. As the peripheral circuit structure and the cell array structure are manufactured separately and then bonded to each other, peripheral transistors may be prevented from being damaged due to various heat treatment processes, and accordingly, it may be possible to improve reliability and electrical characteristics of the three-dimensional semiconductor memory device according to the present disclosure.

Although the present disclosure has been described in connection with the embodiments thereof illustrated in the accompanying drawings, it will be understood by one of ordinary skill in the art that variations in form and detail may be made therein without departing from the spirit and essential feature of the present disclosure. The above disclosed embodiments should thus be considered illustrative and not restrictive.

What is claimed is:

1. A three-dimensional semiconductor memory device, comprising:
    a substrate;
    a peripheral circuit structure on the substrate; and
    a cell array structure comprising a stack structure that includes a plurality of gate electrodes stacked on the peripheral circuit structure, a first source conductive pattern on the stack structure, and a plurality of vertical channel structures in a plurality of vertical channel holes that penetrate the stack structure and the first source conductive pattern,
    wherein one or more of the vertical channel structures comprises:
        a data storage pattern on a sidewall of the vertical channel hole;
        a vertical semiconductor pattern on a sidewall of the data storage pattern; and
        a second source conductive pattern on the vertical semiconductor pattern and surrounded by the data storage pattern,
    wherein a thickness of the data storage pattern between the first source conductive pattern and the second source conductive pattern in a first direction is greater than a thickness of the data storage pattern between the stack structure and the vertical semiconductor pattern in the first direction.

2. The three-dimensional semiconductor memory device of claim 1, wherein the data storage pattern includes:
    a blocking dielectric layer adjacent to a sidewall of the stack structure and a sidewall of the first source conductive pattern;
    a tunneling dielectric layer adjacent to a sidewall of the vertical semiconductor pattern and a sidewall of the second source conductive pattern; and
    a charge storage layer between the blocking dielectric layer and the tunneling dielectric layer,
    wherein the blocking dielectric layer includes:
        a first portion adjacent to the sidewall of the first source conductive pattern; and
        a second portion between the vertical semiconductor pattern and the sidewall of the stack structure,
    wherein a first thickness of the first portion in the first direction is greater than a second thickness of the second portion in the first direction.

3. The three-dimensional semiconductor memory device of claim 2, wherein a thickness of each of the tunneling dielectric layer and the charge storage layer in the first direction is uniform in each of the vertical channel holes.

4. The three-dimensional semiconductor memory device of claim 2, wherein the first thickness is about 1.5 times to about two (2) times the second thickness.

5. The three-dimensional semiconductor memory device of claim 1, wherein the cell array structure further comprises a metal layer on the first source conductive pattern,
    wherein the vertical semiconductor pattern is spaced apart from the metal layer, and
    wherein the second source conductive pattern is in contact with the metal layer.

6. The three-dimensional semiconductor memory device of claim 5, wherein the first source conductive pattern is in contact with the metal layer.

7. The three-dimensional semiconductor memory device of claim 5, wherein the cell array structure further comprises an interlayer dielectric layer between the first source conductive pattern and the metal layer, and
    wherein the thickness of the data storage pattern between the first source conductive pattern and the second source conductive pattern in the first direction is greater than a thickness of the data storage pattern between the interlayer dielectric layer and the second source conductive pattern in the first direction.

8. The three-dimensional semiconductor memory device of claim 7, wherein the data storage pattern includes:
    a blocking dielectric layer adjacent to a sidewall of the stack structure, a sidewall of the first source conductive pattern, and a sidewall of the interlayer dielectric layer;
    a tunneling dielectric layer adjacent to a sidewall of the vertical semiconductor pattern and a sidewall of the second source conductive pattern; and
    a charge storage layer between the blocking dielectric layer and the tunneling dielectric layer,
    wherein the blocking dielectric layer includes:
        a first portion adjacent to the sidewall of the first source conductive pattern;
        a second portion between the vertical semiconductor pattern and the sidewall of the stack structure; and
        a third portion between the second source conductive pattern and the interlayer dielectric layer,
    wherein a first thickness of the first portion in the first direction is greater than a second thickness of the second portion in the first direction and greater than a third thickness of the third portion in the first direction.

9. The three-dimensional semiconductor memory device of claim 5, wherein the second source conductive pattern includes:
    a first portion adjacent to the first source conductive pattern;
    a second portion in contact with the metal layer; and
    a third portion between the first portion and the second portion,
    wherein each of the first portion and the second portion has a width that decreases with decreasing distance from the metal layer, and
    wherein the third portion has a width that increases with decreasing distance from the metal layer.

10. The three-dimensional semiconductor memory device of claim 1, wherein
    a top surface of the second source conductive pattern is at a level higher than a level of a top surface of the first source conductive pattern.

11. The three-dimensional semiconductor memory device of claim 1, wherein a bottom surface of the second source conductive pattern is at a level lower than a level of a bottom surface of the first source conductive pattern.

12. The three-dimensional semiconductor memory device of claim 11, wherein a level difference between the bottom surface of the first source conductive pattern and the bottom surface of the second source conductive pattern is in a range of about one (1) nanometer (nm) to about ten (10) nm.

13. The three-dimensional semiconductor memory device of claim 1,
wherein the peripheral circuit structure comprises:
a plurality of peripheral transistors on the substrate; and
a plurality of first bonding pads connected to the peripheral transistors,
wherein the cell array structure further comprises:
a plurality of bit lines connected to the vertical channel structures; and
a plurality of second bonding pads connected to the bit lines, and
wherein the first bonding pad and the second bonding pad are integrally bonded with each other.

14. The three-dimensional semiconductor memory device of claim 1, wherein one or more of the vertical channel structures has a width that decreases with increasing distance from the substrate.

15. The three-dimensional semiconductor memory device of claim 1, wherein one or more of the gate electrodes of the stack structure have lengths that increase with increasing distance from the substrate.

16. A three-dimensional semiconductor memory device, comprising:
a substrate;
a peripheral circuit structure on the substrate; and
a cell array structure on the peripheral circuit structure,
wherein the peripheral circuit structure comprises:
a plurality of peripheral transistors on the substrate;
a plurality of peripheral circuit lines on the peripheral transistors; and
a plurality of first bonding pads connected through the peripheral circuit lines to the peripheral transistors,
wherein the cell array structure comprises:
a plurality of second bonding pads, each of which contacts at least one of the first bonding pads of the peripheral circuit structure;
a plurality of connection circuit lines on the second bonding pads;
a plurality of bit lines connected through the connection circuit lines to the second bonding pads;
a stack structure that includes a plurality of gate electrodes stacked on the bit lines;
a first source conductive pattern on the stack structure;
a plurality of vertical channel structures connected to the bit lines and in a plurality of vertical channel holes that penetrate the stack structure and the first source conductive pattern;
a first metal layer on the first source conductive pattern;
a second metal layer spaced apart in a first direction from the first metal layer;
an insulating layer on the stack structure and the first and second metal layers;
a plurality of cell contacts that penetrate the insulating layer and connect with the gate electrodes of the stack structure; and
a plurality of through contacts that penetrate the insulating layer and connect with the first and second metal layers,
wherein the stack structure is between the first metal layer and the peripheral circuit structure,
wherein one or more of the vertical channel structures includes:
a data storage pattern on a sidewall of the vertical channel hole;
a vertical semiconductor pattern on a sidewall of the data storage pattern; and
a second source conductive pattern surrounded by the data storage pattern and between the vertical semiconductor pattern and the first metal layer, and
wherein a thickness of the data storage pattern between the first source conductive pattern and the second source conductive pattern in the first direction is greater than a thickness of the data storage pattern between the stack structure and the vertical semiconductor pattern in the first direction.

17. The three-dimensional semiconductor memory device of claim 16, wherein the second source conductive pattern contacts a top surface of the vertical semiconductor pattern and a bottom surface of the first metal layer, wherein:
the second source conductive pattern has a width that decreases with increasing distance from the substrate;
one or more of the vertical channel structures has a width that decreases with increasing distance from the substrate, and
one or more of the gate electrodes of the stack structure have lengths that increase with increasing distance from the substrate.

18. The three-dimensional semiconductor memory device of claim 16, wherein the plurality of vertical channel holes comprises a first vertical channel hole and a second vertical channel hole connected to the first vertical channel hole, and
wherein the first vertical channel hole and the second vertical channel hole have diameters that are different at a boundary where the first and second vertical channel holes are connected to each other.

19. The three-dimensional semiconductor memory device of claim 16, wherein the second source conductive pattern includes a material that is the same as a material of the first source conductive pattern.

20. An electronic system, comprising:
a three-dimensional semiconductor memory device comprising a substrate, a peripheral circuit structure on the substrate, a cell array structure on the peripheral circuit structure, and an input/output pad on the cell array structure; and
a controller configured to connect with the three-dimensional semiconductor memory device through the input/output pad and to control the three-dimensional semiconductor memory device,
wherein the cell array structure comprises:
a stack structure that includes a plurality of gate electrodes stacked on the peripheral circuit structure;
a first source conductive pattern on the stack structure; and
a plurality of vertical channel structures in a plurality of vertical channel holes that penetrate the stack structure and the first source conductive pattern,
wherein one or more of the vertical channel structures includes:
a data storage pattern on a sidewall of the vertical channel hole;
a vertical semiconductor pattern on a sidewall of the data storage pattern; and
a second source conductive pattern on the vertical semiconductor pattern and surrounded by the data storage pattern,
wherein the data storage pattern includes:
a first portion between the first source conductive pattern and the second source conductive pattern; and a second portion between the stack structure and the vertical semiconductor pattern, wherein a thickness of the first portion is greater than a thickness of the second portion.

* * * * *